United States Patent
Pan et al.

(10) Patent No.: US 11,012,186 B2
(45) Date of Patent: May 18, 2021

(54) ERROR CHECK-BASED SYNCHRONIZATION AND BROADCAST CHANNEL

(71) Applicant: IDAC Holdings, Inc., Wilmington, DE (US)

(72) Inventors: Kyle Jung-Lin Pan, Saint James, NY (US); Fengjun Xi, San Diego, CA (US)

(73) Assignee: IDAC Holdings, Inc., Wilmington, DE (US)

( * ) Notice: Subject to any disclaimer, the term of this patent is extended or adjusted under 35 U.S.C. 154(b) by 0 days.

(21) Appl. No.: 16/473,013

(22) PCT Filed: Jan. 4, 2018

(86) PCT No.: PCT/US2018/012331
§ 371 (c)(1),
(2) Date: Jun. 24, 2019

(87) PCT Pub. No.: WO2018/129147
PCT Pub. Date: Jul. 12, 2018

(65) Prior Publication Data
US 2019/0319745 A1    Oct. 17, 2019

Related U.S. Application Data

(60) Provisional application No. 62/555,908, filed on Sep. 8, 2017, provisional application No. 62/500,769, filed
(Continued)

(51) Int. Cl.
*H04J 11/00* (2006.01)
*H04L 5/00* (2006.01)
(Continued)

(52) U.S. Cl.
CPC ........ *H04L 1/0061* (2013.01); *H04J 11/0073* (2013.01); *H04J 11/0076* (2013.01);
(Continued)

(58) Field of Classification Search
CPC ............... H03M 13/635; H04J 11/0073; H04J 11/0076; H04J 11/0079; H04L 1/0057;
(Continued)

(56) References Cited

U.S. PATENT DOCUMENTS 8,982,759 B2 *  3/2015  Kim ...................... H04L 5/0053
                                                              370/310
2005/0108610 A1  5/2005  Kim et al.
(Continued)

FOREIGN PATENT DOCUMENTS

WO   WO2017/171929      *  9/2016
WO   WO 2017-117489 A1    7/2017

OTHER PUBLICATIONS

3GPP TS 36.211 V13.2.0, 3rd Generation Partnership Project; Technical Specification Group Radio Access Network; Evolved Universal Terrestrial Radio Access (E-UTRA); Physical channels and modulation, 2016, 3GPP (Year: 2016).*
(Continued)

*Primary Examiner* — Harun Chowdhury
(74) *Attorney, Agent, or Firm* — Condo Roccia Koptiw LLP

(57) ABSTRACT

Systems, methods, and instrumentalities are disclosed for error check-based synchronization. Physical Broadcast Channel (PBCH) data may be determined. A scrambling (e.g., a first scrambling) of the PBCH data may be scrambled via a sequence (e.g., a first sequence). The first sequence may be based on a cell ID and/or timing information. Error check bits may be attached to the scrambled PBCH data and to the timing information. The error check bits may include one or more cyclic redundancy check (CRC) bits. The scrambled PBCH data, the timing information (e.g., the unscrambled timing information), and/or the attached error check bits may be polar encoded. The polar encoding may result in polar encoded bits. A scrambling (e.g., a second
(Continued)

scrambling) of the polar encoded bits may be scrambled via a sequence (e.g., a second sequence). The first sequence and the second sequence may be different. The polar encoded bits may be transmitted.

12 Claims, 23 Drawing Sheets

Related U.S. Application Data on May 3, 2017, provisional application No. 62/443,038, filed on Jan. 6, 2017.

(51) Int. Cl.
*H04L 1/00* (2006.01)
*H04L 29/08* (2006.01)

(52) U.S. Cl.
CPC .......... *H04L 1/0072* (2013.01); *H04L 5/0053* (2013.01); *H04L 69/324* (2013.01)

(58) Field of Classification Search
CPC ....... H04L 1/0061; H04L 1/0072; H04L 5/00; H04L 5/0048; H04L 5/0051; H04L 5/0053
USPC ................................ 370/252, 329, 330, 342
See application file for complete search history.

(56) References Cited

U.S. PATENT DOCUMENTS

| | | |
|---|---|---|
| 2011/0255631 A1 | 10/2011 | Pi et al. |
| 2012/0198305 A1 | 8/2012 | Abu-Surra et al. |
| 2017/0302494 A1 | 10/2017 | Liu et al. |
| 2018/0167946 A1* | 6/2018 | Si ............................ H04L 5/00 |
| 2019/0028237 A1 | 1/2019 | Pan et al. |

OTHER PUBLICATIONS

3rd Generation Partnership Project (3GPP), R1-1611254, "Details of the Polar Code Design", Huawei, HiSilicon, TSG RAN WG1 Meeting #87, Reno, USA, Nov. 10-14, 2016, 15 pages.

3rd Generation Partnership Project (3GPP), R1-1612306, "On the Hardware Implementation of Channel Decoders for Short Block Lengths", AccelerComm, TSG RAN WG1 Meeting #87, Reno, USA, Nov. 14-18, 2016, pp. 1-9.

3rd Generation Partnership Project (3GPP), R1-163130, "Considerations on Channel Coding for NR", CATR, TSG RAN WG1 Meeting #84bis, Busan, Korea, Apr. 11-15, 2016, 3 pages.

3rd Generation Partnership Project (3GPP), R1-163943, "RAN1 Agreements for Rel-13 NB-IoT", WI Rapporteur (Ericsson), TSG-RAN WG1 Meeting #84bis, Busan, Korea, Apr. 11-15, 2016, pp. 1-28.

3rd Generation Partnership Project (3GPP), R1-1712526, "NR PBCH Design", Intel Corporation, TSG RAN WG1 Meeting #90, Prague, Czech Republic, Aug. 21-25, 2017, pp. 1-11.

3rd Generation Partnership Project (3GPP), TR 38.913 V0.3.0, "Technical Specification Group Radio Access Network, Study on Scenarios and Requirements for Next Generation Access Technologies (Release 14)", Mar. 2016, pp. 1-30.

Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.

Hattachi et al., "NGMN 5G White Paper", NGMN Alliance, Version 1.0, Feb. 17, 2015, pp. 1-125.

ITU-R, "IMT Vision—Framework and Overall Objectives of the Future Development of IMT for 2020 and Beyond", Recommendation ITU-R M.2083-0, M Series, Mobile, Radiodetermination, Amateur and Related Satellite Services, Sep. 2015, 21 pages.

3rd Generation Partnership Project (3GPP), R1-17xxxxx, "Draft Report of 3GPP TSG RAN WG1 #87 v0.1.0", MCC Support, Nov. 14-18, 2016, Reno, USA, pp. 1-158.

3rd Generation Partnership Project (3GPP), R1-1715246, "WF on scrambling for NR PBCH", Intel, Huawei, HiSilicon, 3GPP TSG RAN WG1 Meting #90, Aug. 21-25, 2017, Prague, Czech Republic, pp. 1-2.

3rd Generation Partnership Project (3GPP), R1-1715458, "Scrambling sequence design for PBCH", Sequans Communications, 3GPP TSG-RAN WG1 Meeting AH_NR#3, Sep. 18-21, 2017, Noagoya, Japan, pp. 1-6.

3rd Generation Partnership Project (3GPP), R1-1716757, "Polar Code Design for NR-PBCH", Ericsson, 3GPP TSG RAN WG1 Meeting NR#3, Sep. 18-21, 2017, pp. 1-11.

* cited by examiner

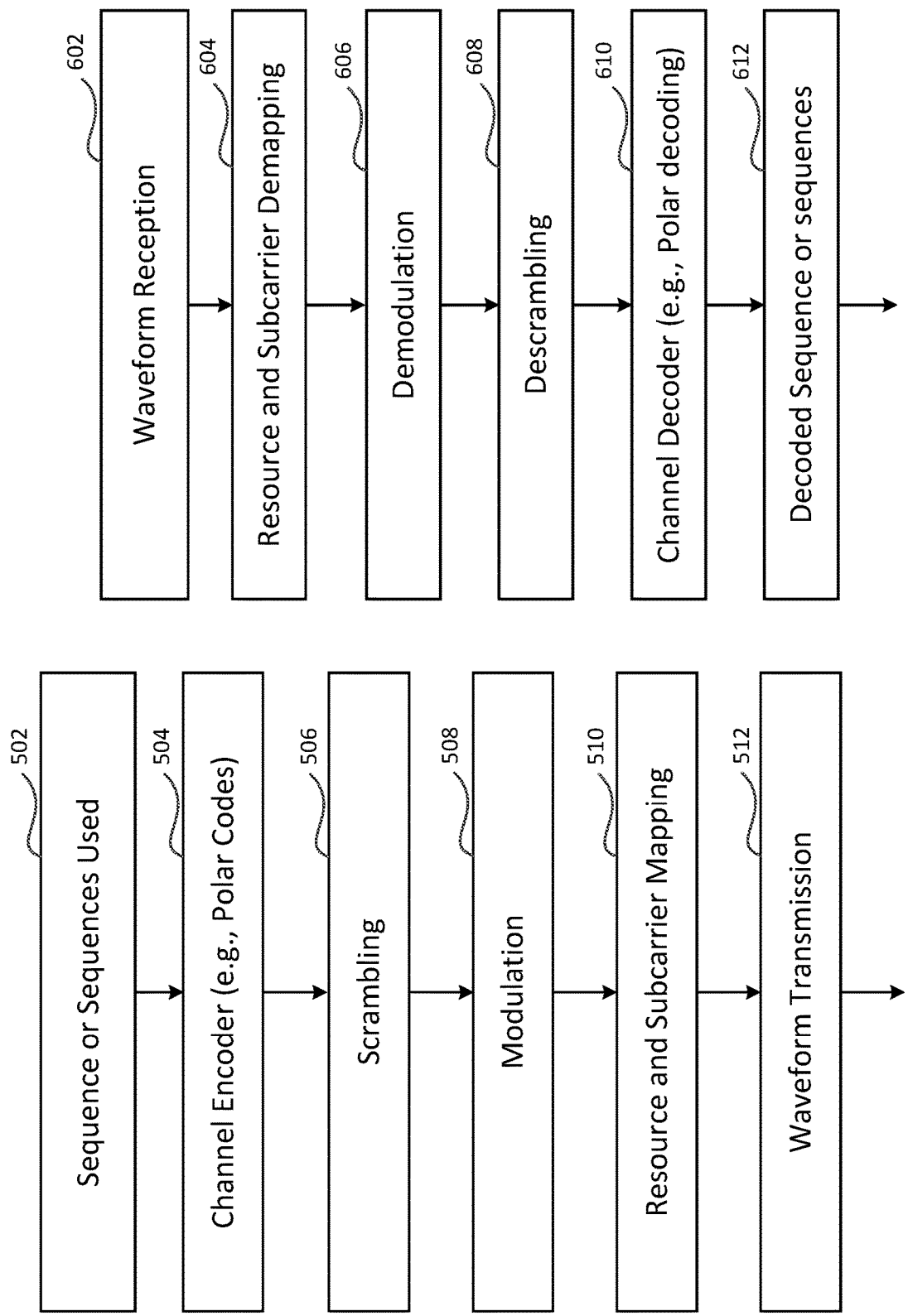

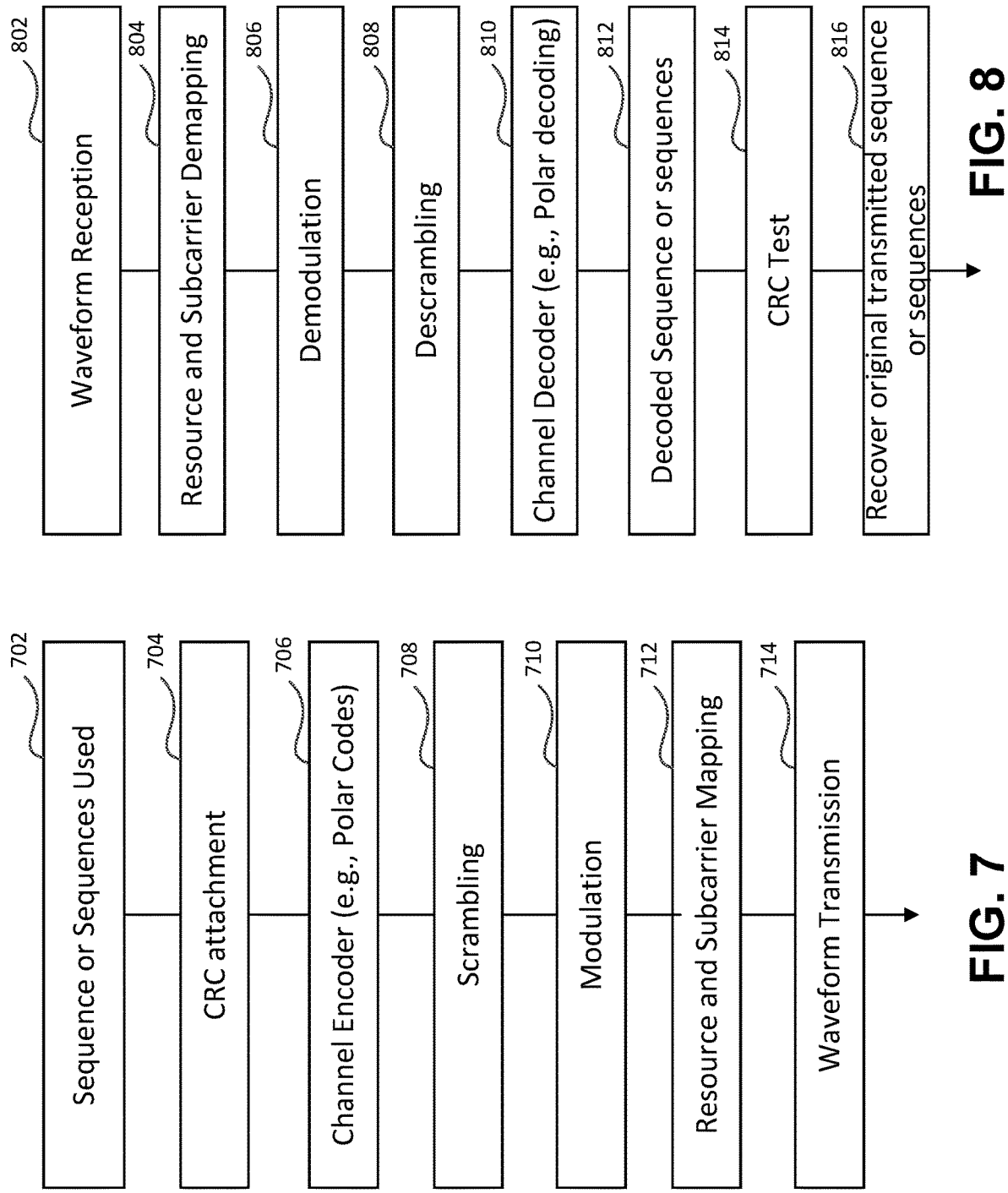

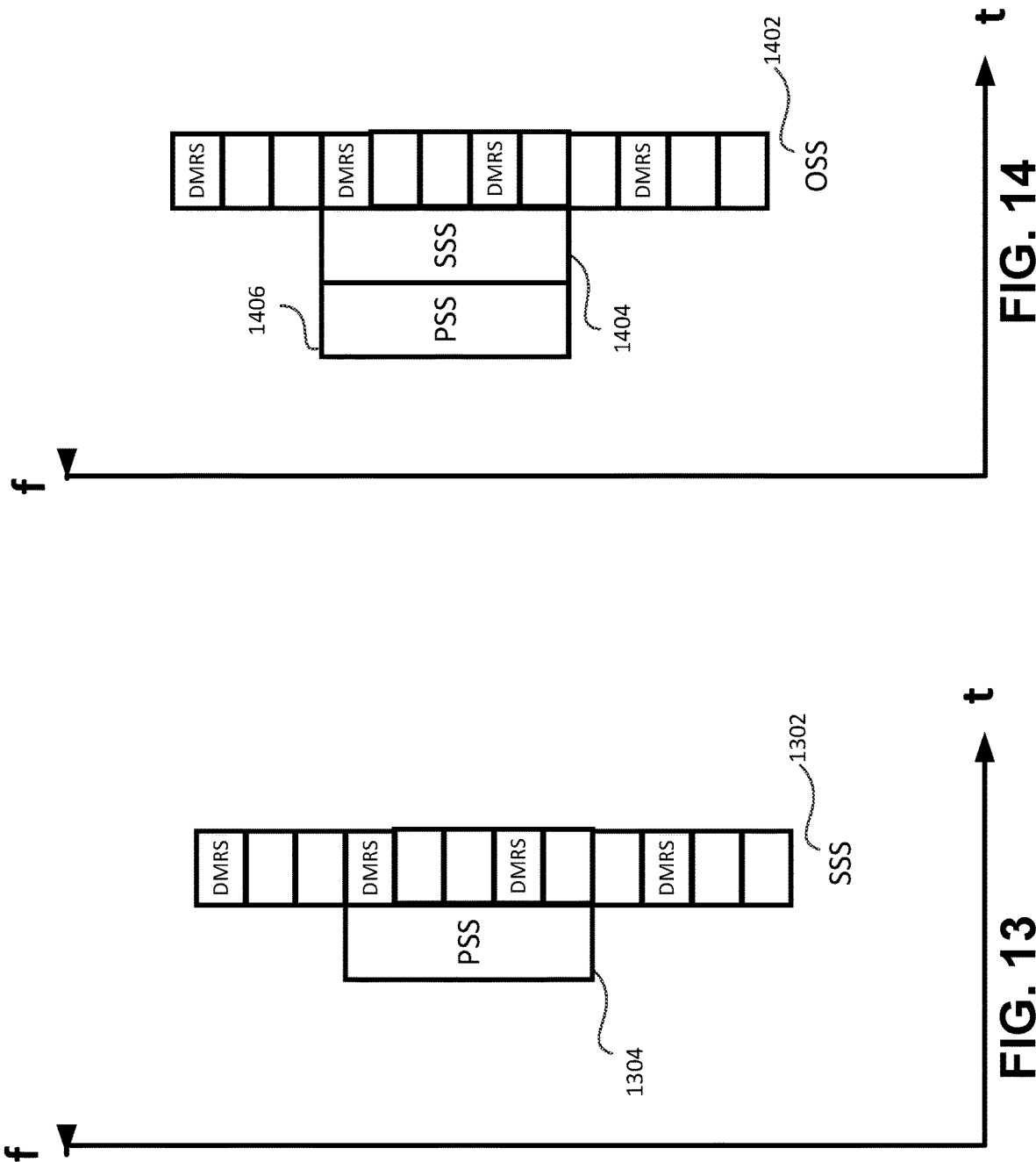

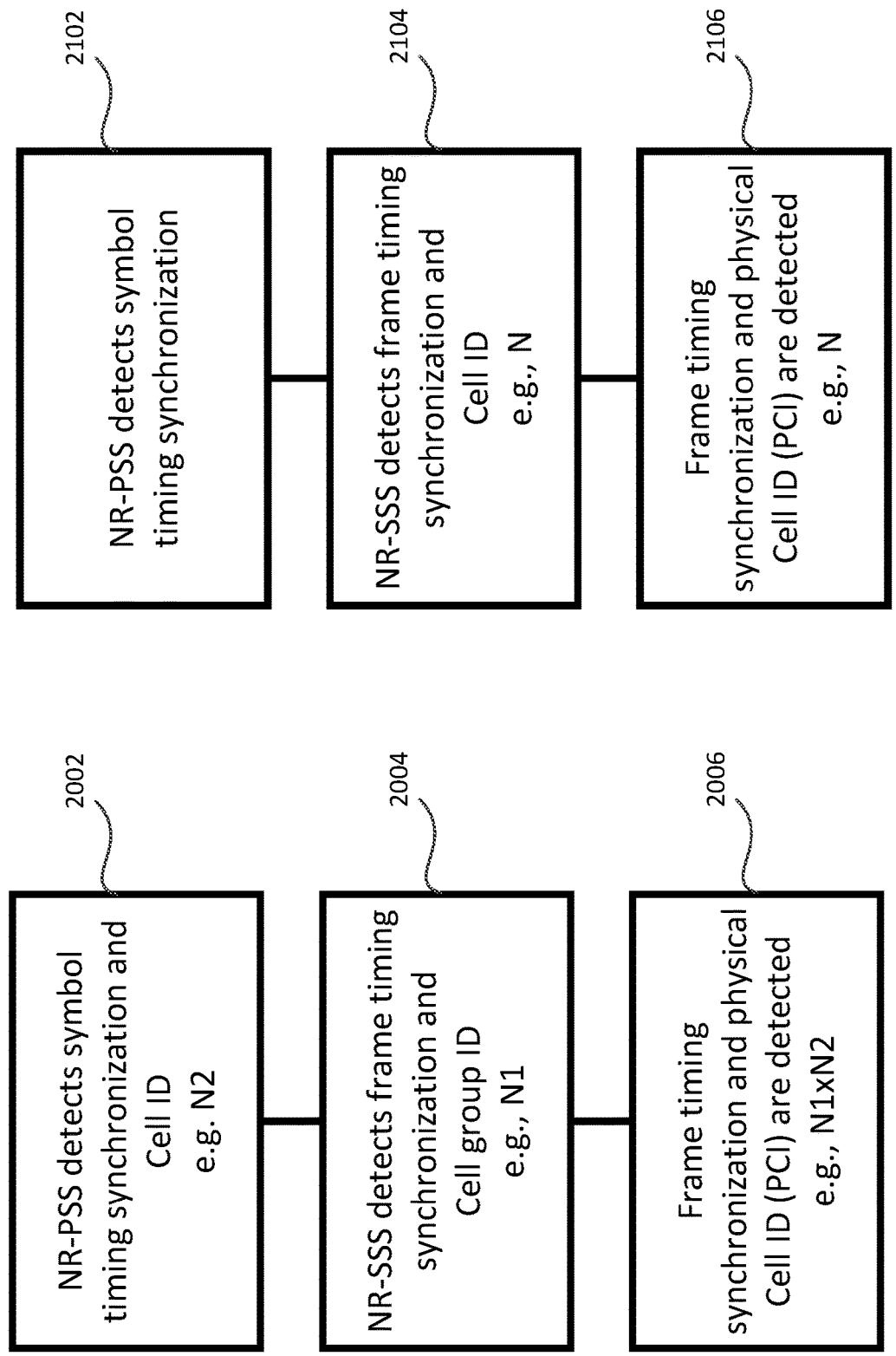

ERROR CHECK-BASED SYNCHRONIZATION AND BROADCAST CHANNEL

CROSS-REFERENCE

This application is the National Stage entry under 35 U.S.C. § 371 of Patent Cooperation Treaty Application PCT/US2018/012331, filed Jan. 4, 2018, which claims the benefit of U.S. Provisional Application No. 62/443,038, filed on Jan. 6, 2017; U.S. Provisional Application No. 62/500,769, filed on May 3, 2017; and U.S. Provisional Application No. 62/555,908, filed on Sep. 8, 2017, which are incorporated herein by reference as if fully set forth.

BACKGROUND

Mobile communications continue to evolve. A fifth generation may be referred to as 5G. A previous generation of mobile communication may be, for example, fourth generation (4G) long term evolution (LTE). Mobile wireless communications implement a variety of radio access technologies (RATs), such as New Radio (NR). Use cases for NR may include, for example, extreme Mobile Broadband (eMBB), Ultra High Reliability and Low Latency Communications (URLLC) and massive Machine Type Communications (mMTC).

SUMMARY

Systems, methods and instrumentalities are disclosed for error check-based synchronization and/or broadcasting. For example, additional information may be provided by a secondary synchronization signal (SSS) and/or broadcast signal and/or channel, e.g., in New Radio (NR). An SSS and/or broadcast signal and/or channel may bear additional information alone or in conjunction (jointly) with a primary synchronization signal (PSS) and/or a Physical Broadcast Channel (PBCH). Additional information may be in the form of, for example, data, a coded sequence or a hybrid thereof. An SSS or PBCH may be provided with error checking and may be encoded, e.g., with Polar codes. Waveform based error checking may be provided, e.g., for non-systematic Polar codes. A reference signal may be provided for an error check-based synchronization signal and/or broadcast signal and channel. An SSS may be payload-based or sequence-based.

Systems, methods, and instrumentalities are disclosed for error check-based synchronization. Physical Broadcast Channel (PBCH) data may be determined. A scrambling (e.g., a first scrambling) of the PBCH data may be scrambled via a sequence (e.g., a first sequence). The first sequence may be based on a cell ID and/or timing information. The timing information may be system frame number (SFN) bits or a subset of SFN bits. Error check bits may be attached to the scrambled PBCH data and to the timing information. The error check bits may include one or more cyclic redundancy check (CRC) bits. The scrambled PBCH data, the timing information (e.g., the unscrambled timing information), and/or the attached error check bits may be polar encoded. The polar encoding may result in polar encoded bits. A scrambling (e.g., a second scrambling) of the polar encoded bits may be scrambled via a sequence (e.g., a second sequence). The second sequence may be based on a cell ID and/or timing information. The timing information may be SS block index bits or a subset of SS block index bits. The first sequence and the second sequence may be the same or different. The polar encoded bits may be transmitted.

BRIEF DESCRIPTION OF THE DRAWINGS

FIG. 5 is an example of a downlink transmission of a coded sequence based NR-SSS.

FIG. 6 is an example of a WTRU receiving and decoding a coded sequence based NR-SSS.

FIG. 7 is an example downlink transmission of a coded sequence CRC-based NR-SSS.

FIG. 8 is an example reception of a WTRU to receive a coded sequence CRC-based NR-SSS.

FIG. 13 is an example of an error check-based synchronization signal for SSS.

FIG. 14 is an example of an error check-based synchronization signal for another synchronization signal (OSS).

FIG. 20 is an example of a synchronization.

FIG. 21 is another example of a synchronization.

DETAILED DESCRIPTION

A detailed description of illustrative embodiments will now be described with reference to the various Figures. Although this description provides a detailed example of possible implementations, it should be noted that the details are intended to be exemplary and in no way limit the scope of the application.

Figure 1A:
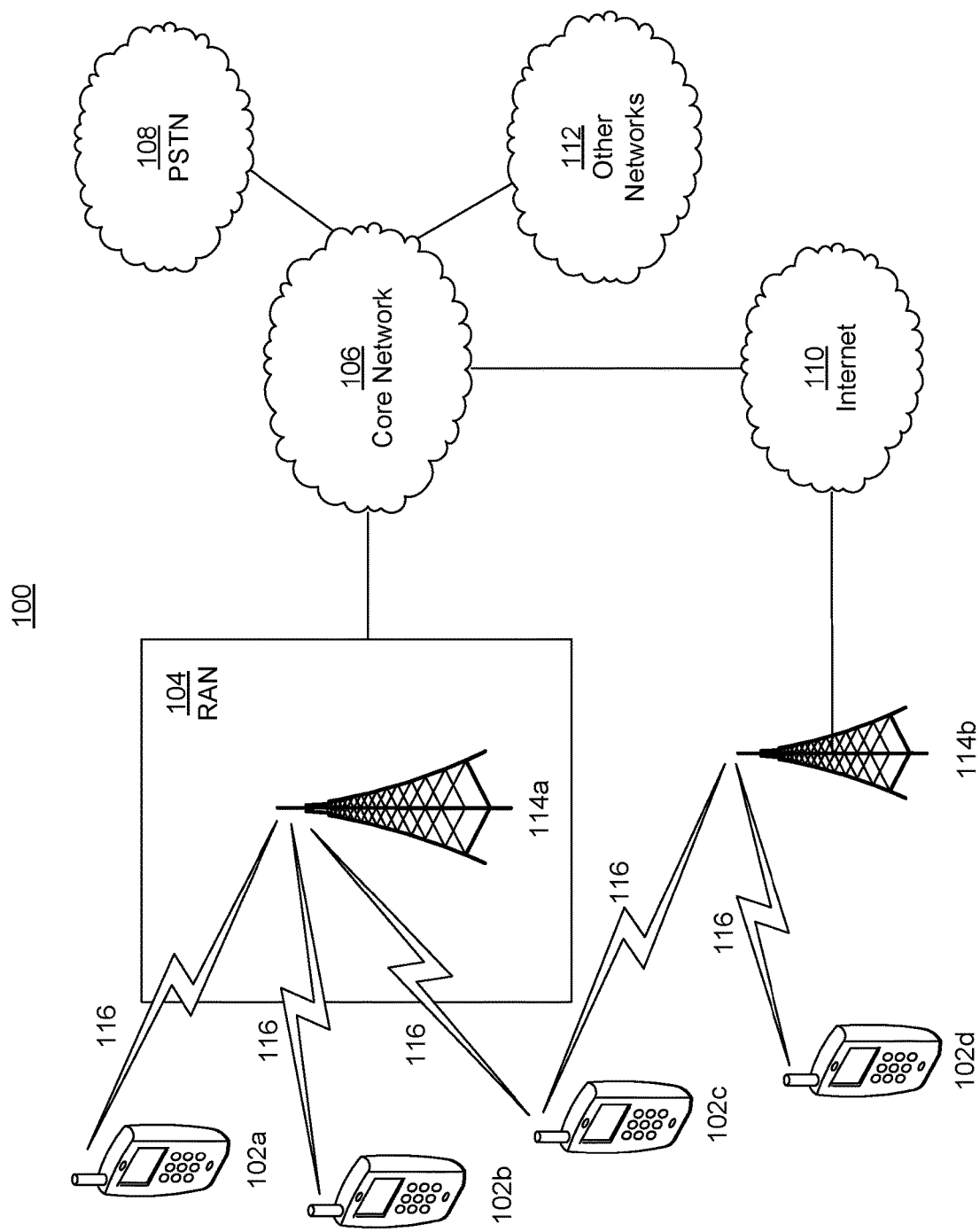
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114 a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114 a may be part of the RAN 104/113, which may also include other base stations and/or network elements (not shown), such as a base station controller (BSC), a radio network controller (RNC), relay nodes, etc. The base station 114 a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114 a may be divided into three sectors. Thus, in one embodiment, the base station 114 a may include three transceivers, i.e., one for each sector of the cell. In an embodiment, the base station 114 a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114 a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114 a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114 a and the WTRUs 102a, 102b, 102c may implement a radio technology such as NR Radio Access, which may establish the air interface 116 using New Radio (NR).

In an embodiment, the base station 114 a and the WTRUs 102a, 102b, 102c may implement multiple radio access technologies. For example, the base station 114 a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114 a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
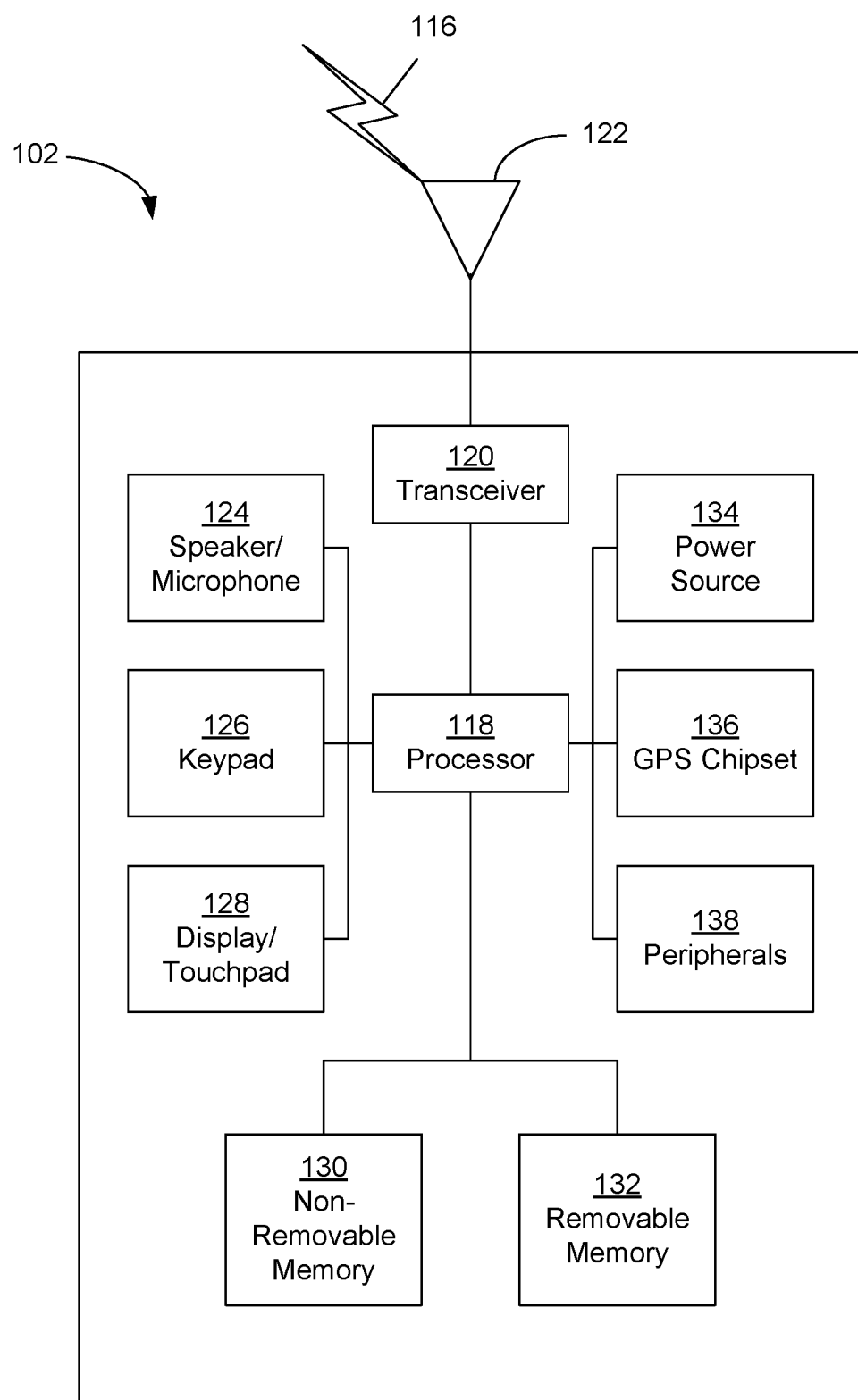
FIG. 1B is a system diagram illustrating an example wireless transmit/receive unit (WTRU) that may be used within the communications system illustrated in FIG. 1A.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
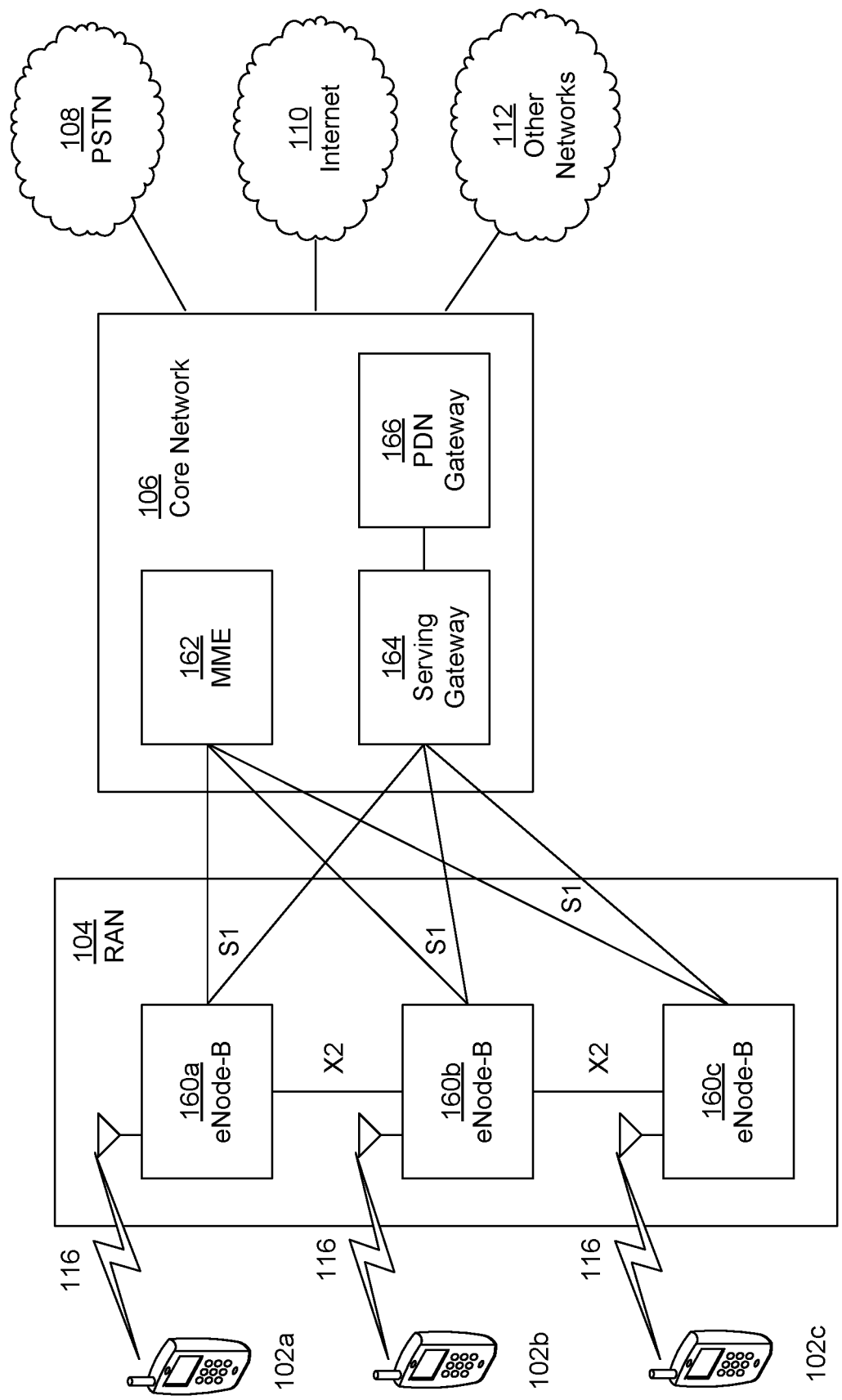
FIG. 1C is a system diagram illustrating an example radio access network (RAN) and an example core network (CN) that may be used within the communications system illustrated in FIG. 1A.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
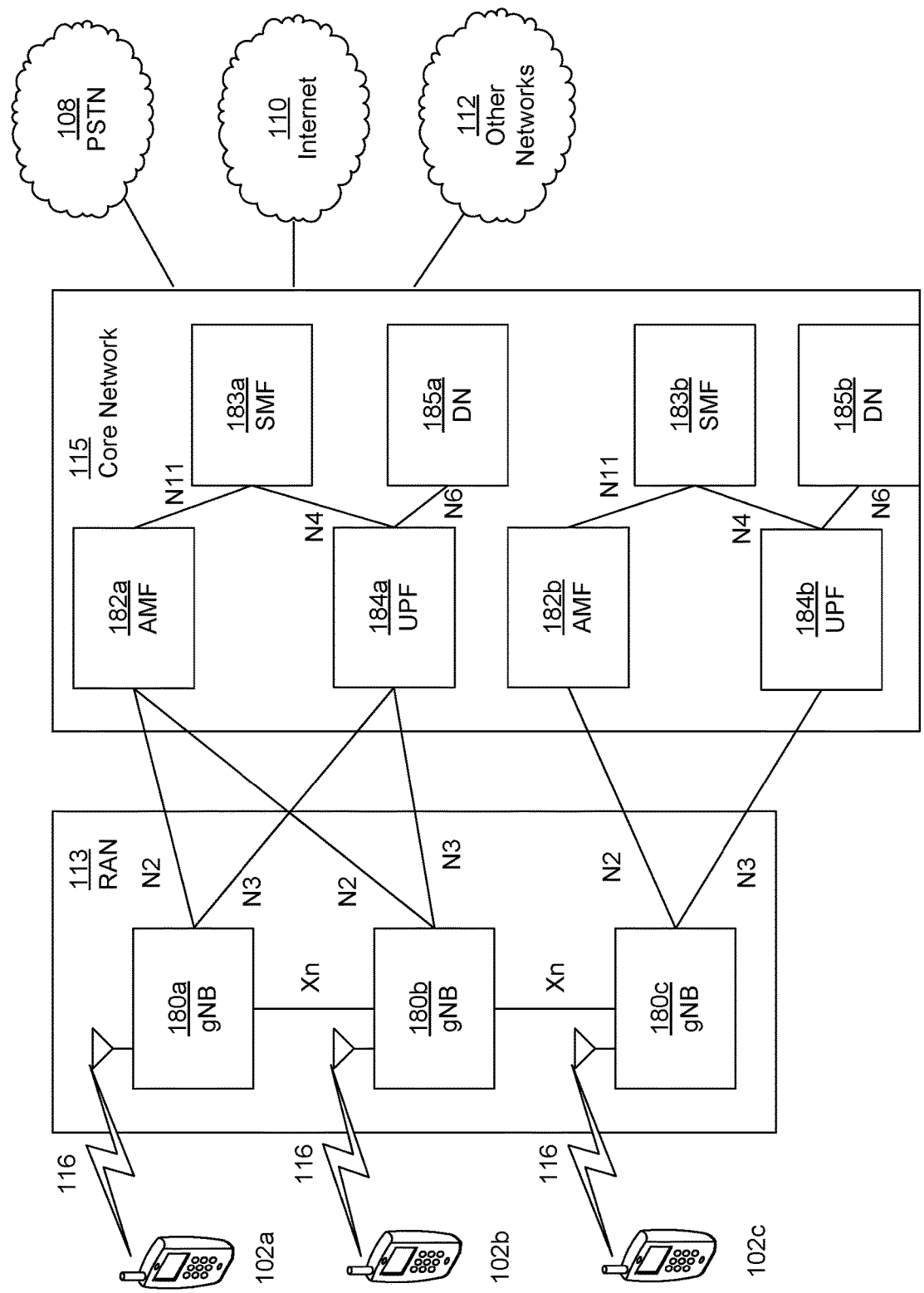
FIG. 1D is a system diagram illustrating a further example RAN and a further example CN that may be used within the communications system illustrated in FIG. 1A.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180 a may transmit multiple component carriers to the WTRU 102 a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102 a may receive coordinated transmissions from gNB 180 a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device (s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Beamforming may be implemented, for example, in 5G New Radio (NR).

A broad classification of use cases for 5G systems may include, for example, Enhanced Mobile Broadband (eMBB), Massive Machine Type Communications (mMTC), and/or Ultra Reliable and Low Latency Communications (URLLC). Different use cases may have different requirements, such as higher data rate, higher spectrum efficiency, lower power, higher energy efficiency, lower latency, and/or higher reliability. A range (e.g., a wide range) of spectrum bands (e.g., ranging from 700 MHz to 80 GHz) may be utilized, for example, in a variety of deployment scenarios.

Path loss (e.g., severe path loss) may limit a coverage area, for example, as carrier frequency increases. Transmission in millimeter wave systems may incur non-line-of-sight losses, e.g., diffraction loss, penetration loss, Oxygen absorption loss, foliage loss, etc. A base station and WTRU may (e.g., during initial access) overcome high path losses and discover one another. Utilizing one or more (e.g., dozens, hundreds, etc.) of antenna elements to generated beam formed signal may compensate for severe path loss, e.g., by providing beam forming gain. Beamforming may include, for example, digital, analog, and/or hybrid beamforming.

Initial synchronization and/or a broadcast channel may be implemented, for example, in LTE.

A WTRU may (e.g., during a cell search) acquire time and frequency synchronization with a cell and/or may detect a Cell ID of a cell. Synchronization signals may be transmitted (e.g., in LTE), for example, in the 0th and 5th subframes of a (e.g., every) radio frame and/or may be used for time and frequency synchronization (e.g., during initialization). A WTRU may (e.g., as part of a system acquisition) synchronize (e.g., synchronize sequentially) to an OFDM symbol, slot, subframe, half-frame, and/or radio frame (e.g., based on synchronization signals). Synchronization signals may include, for example, Primary Synchronization Signal (PSS) and/or Secondary Synchronization Signal (SSS).

PSS may be used, for example, to obtain slot, subframe, and/or half-frame boundary. PSS may (e.g., may also) provide physical layer cell identity (PCI), for example, within a cell identity group.

SSS may be used, for example, to obtain a radio frame boundary. SSS may (e.g., may also) enable a WTRU to determine a cell identity group (e.g., a range from 0 to 167).

A WTRU may (e.g., may, following a successful synchronization and PCI acquisition) decode a Physical Broadcast Channel (PBCH), for example, with the assistance of CRS. A WTRU may (e.g., may also) acquire MIB information, e.g., regarding system bandwidth, System Frame Number (SFN), and/or PHICH configuration.

LTE synchronization signals and PBCH may be transmitted continuously, for example, according to a standardized periodicity.

A channel coding scheme for an eMBB control channel (e.g., UL and/or DL control channel) may be a Polar code.

Polar codes (e.g., similar to Turbo codes and LDPC codes) may be categorized as capacity achieving codes. Polar codes may provide linear block codes, for example, with low encoding and/or decoding complexity, a low error floor, and/or explicit constructions. Decoders for Polar codes may include, for example, a successive cancellation (SC) decoder, SC list (SCL) decoder, and/or CRC-Aided (CA)-SCL decoders.

A Parity Check (PC) Polar code may improve coding performance. For example, a Parity Check (PC) Polar code may improve coding performance without CRC bits for error correction by using parity-check (PC) frozen bits to prune a list tree on the fly (e.g., instead of using a CRC-aided list-tree path selection at the final stage for CA-SCL Polar decoding). A difference between a PC-polar code and another (e.g., regular) polar code may be that a subset of the frozen sub-channel set may be selected as PC-frozen sub-channels. A PC function may be established, for example, over sub-channels for error correction and/or may be used to set the value of a PC-frozen set. A PC function may be established, for example, as forward-only (e.g., to be consistent with a successive cancellation-based decoder).

Error-check based NR-SSS may be performed, e.g., in NR.

Figure 2:
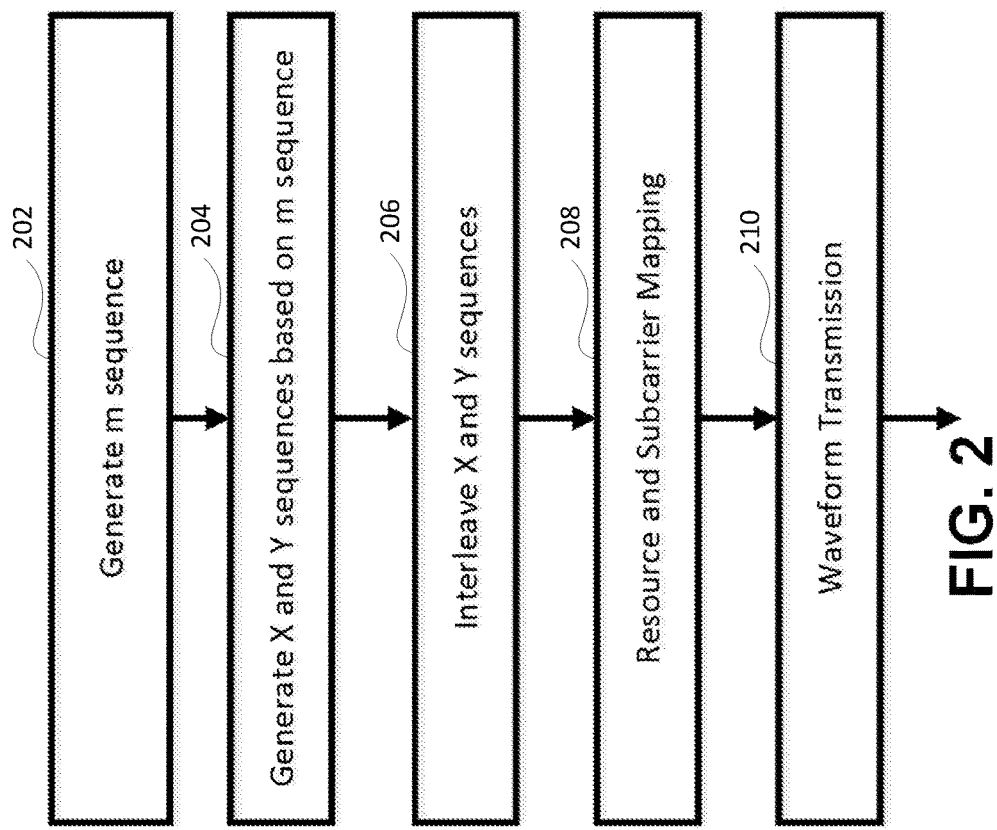
FIG. 2 is an example secondary synchronization signal (SSS) implementation.

FIG. 2 is an example SSS implementation. SSS may be based on an m sequence. At 202, an m sequence may be generated. X and Y sequences may be generated based on an m sequence, at 204. X and Y sequences may be interleaved, for example, in the frequency domain, at 206. Interleaved X and Y sequences may be mapped to resources and/or sub-carriers, at 208. Interleaved X and Y sequences may be transmitted, at 210. For example, interleaved X and Y sequences may be transmitted by waveform (e.g., CP-OFDM waveform).

PSS may not support use cases and/or features of different bandwidth systems, such as beamforming, high frequency, and/or large spectrum in NR. SSS may be implemented to share the burden (e.g., responsibilities) of PSS in NR. Information (e.g., information beyond radio frame boundary and cell identity group) may be carried by SSS in NR. SSS may be implemented to support information (e.g., more information) carried by NR-SSS with robust performance in NR. One or more WTRUs may be used to facilitate NR-SSS (e.g., the NR-SSS design).

Waveform based error checking may be performed for non-systematic channel codes, such as non-systematic PC Polar codes. Waveform based data integrity checks may be performed for systematic channel codes.

SSS may be based on data. For example, SSS may be based on data and not based on a sequence.

Figure 3:
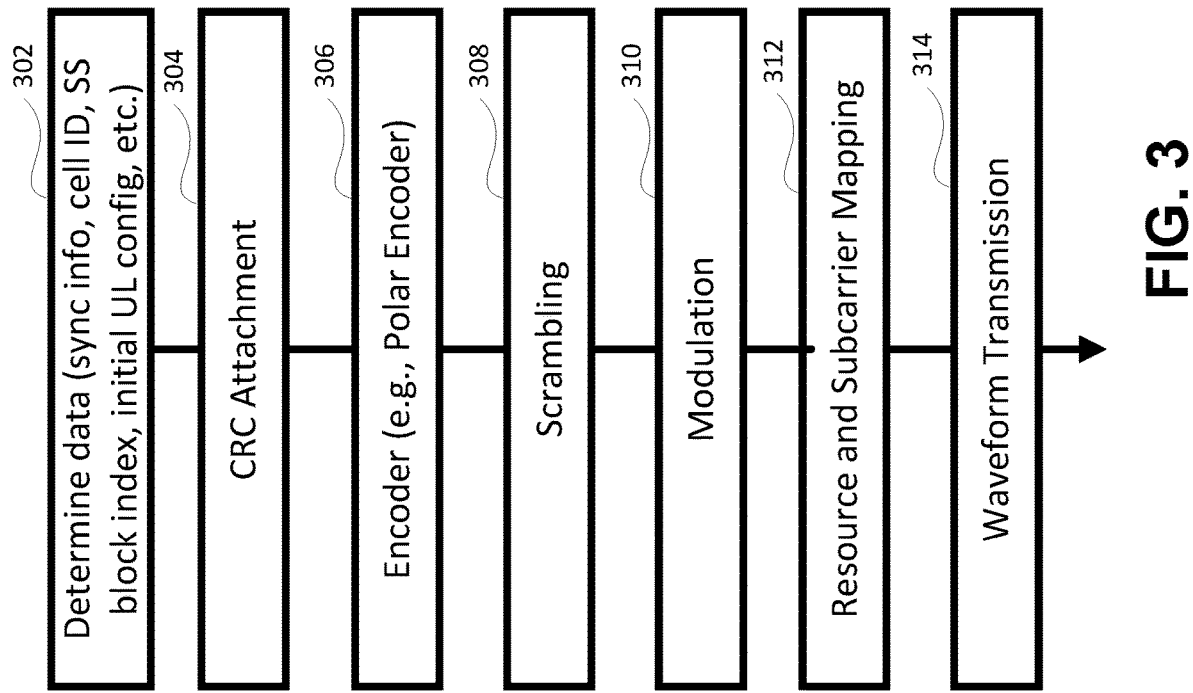
FIG. 3 is an example data-bearing new radio (NR)-SSS implementation.

FIG. 3 is an example of an NR-SSS implementation, e.g., data-bearing based NR-SSS. The NR-SSS may be performed by a network entity, e.g., a gNB. Data (e.g., a data payload) may be determined, at 302. For example, data may be determined based on information to be transmitted in a synchronization signal (e.g., a NR-SSS). Data may be referred to as, for example, a "SYNC payload." A SYNC payload in NR-SSS may carry information. For example, the data (e.g., the SYNC payload) in NR-SSS may include information including one or more of: cell group ID, frame boundary, Synchronization Signal (SS)-block index, multi-beam configuration, other synchronization or configuration information, etc. A cell group ID may be a cell ID or the like. A frame boundary may be a system frame number or the like. Synchronization Signal (SS)-block index may be a SS/PBCH block index, a SS block time index, or the like. Synchronization or configuration information may include a timing information (e.g., system frame number), an ID (e.g., a cell ID), and/or other synchronization information. The implementation may be applied to NR-PBCH, for example, which may be used to carry SYNC payload (e.g., full or partial).

A SYNC payload may be attached to/with error check bits, at 304. Error check bits may include, for example, cyclic redundancy check (CRC) bits. For example, a SYNC payload may be attached to/with CRC bits. A SYNC payload (e.g., with error check bits or CRC) may be encoded, at 306. For example, a SYNC payload may be encoded using a channel encoder, e.g., a Polar Encoder using Polar codes. An encoded SYNC payload may be scrambled, at 308. The encoded SYNC payload may be modulated, at 310. The encoded SYNC payload may be mapped to resources and/or subcarriers, at 312. An encoded SYNC payload may be transmitted, at 314. For example, the encoded SYNC payload may be transmitted in the SSS and/or the NR-PBCH. The encoded SYNC payload may be transmitted using a waveform, such as CP-OFDM, CP DFT-s-OFDM, UW OFDM, and/or UW DFT-s-OFDM.

Polar codes may be used with a data-bearing NR-SSS.

Figure 4:
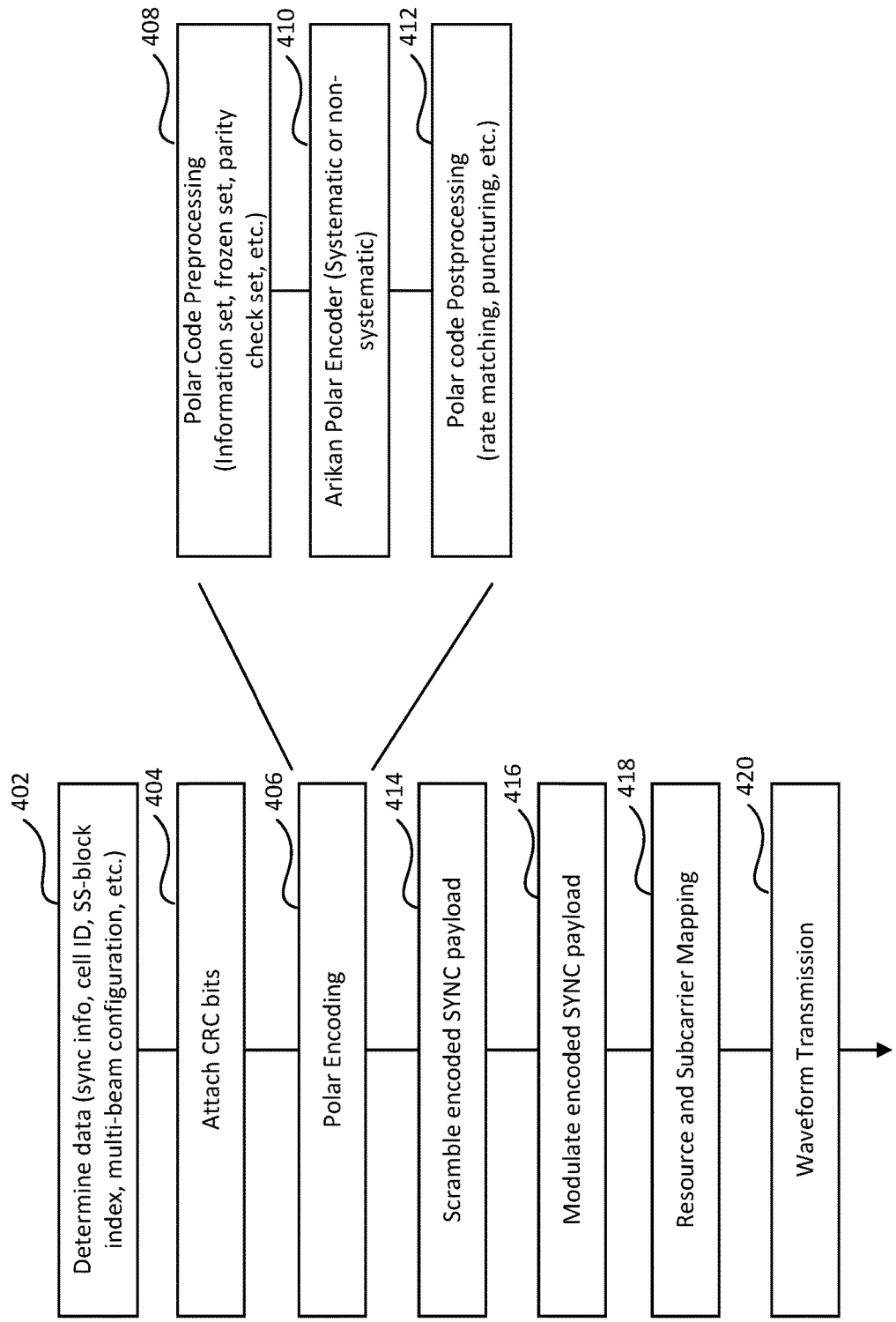
FIG. 4 is an example implementation of a Polar coded data bearing NR-SSS.

FIG. 4 is an example implementation of a polar coded based NR-SSS (or NR-PBCH). The polar coded based NR-SSS may be performed by an gNB. A SYNC payload may be determined. For example, data may be determined, at 402. The SYNC payload may carry information (e.g., data). For example, the SYNC payload may carry information including one or more of: cell group ID, frame boundary, Synchronization Signal (SS)-block index, multi-beam configuration, other synchronization or configuration information, etc. The determined SYNC payload may be attached to/with error check bits, at 404. Error check bits may include, for example, CRC bits. A resulting SYNC payload with error check bits or CRC may be encoded, for example, using Polar codes, at 406.

A Polar encoding may include one or more of the following. For example, the polar encoding may include pre-processing 408, Polar Encoder 410 (e.g., for Polar coding), and/or post-processing 412. Pre-processing 408 may include, for example, a configuration for an information-set, frozen-set selection, a parity check (PC), and/or a setup or determination of their values. Polar coder 410 may, for example, be an Arikan Polar encoder. Polar codes may include systematic Polar codes or non-systematic Polar codes. Post-processing 412 may include, for example, puncturing, rate matching, and/or shortening.

An encoder may determine (e.g., decide) sub-channels, e.g., in pre-processing 408. In an example, a (e.g., one or more) sub-channel may correspond to a (e.g., one or more) bit, e.g., a frozen bit, information bit, and/or PC-frozen bit. Sub-channels with high reliability may be chosen, for example, to transmit information bits. Sub-channels with less reliable (e.g., unreliable) sub-channels may be set to zero. Some sub-channels may be selected, for example, to transmit PC bits. The number (e.g., total number) of sub-channels may be a power-of-two value and/or may be referred to as a mother code block length. Information bits may be set to an information-set. Zeros may be set to a frozen-set. Parity-check bits may be calculated by a parity-check and/or may be set to the PC-frozen-set.

Polar coding (e.g., via Polar Encoder 410) may obtain the output or N coded bits, for example, by multiplying the N sub-channels at the input with a Kronecker matrix in accordance with Eq. 1:

$$[x_0, x_1, x_2, \ldots x_{N-1}] = [u_0, u_1, u_2 \ldots u_{N-1}]G \qquad \text{Eq. 1}$$

where G may be a Kronecker matrix in accordance with Eq. 2:

$$G = \begin{bmatrix} 1 & 0 & 0 & 0 \\ & \cdots & & \\ 1 & 1 & 0 & 0 \\ \vdots & & \ddots & \vdots \\ 1 & 0 & 1 & 0 \\ & \cdots & & \\ 1 & 1 & 1 & 1 \end{bmatrix} \qquad \text{Eq. 2}$$

Post-processing 412 may shorten the N coded into M coded bits, for example, by puncturing. An encoded SYNC payload (e.g., after post-processing and puncturing) may be scrambled, at 414. The encoded SYNC payload may be modulated, at 416. The encoded SYNC payload may be mapped to resources and/or subcarriers, at 418. The encoded SYNC payload may be transmitted, at 420. For example, the encoded SYNC payload may be transmitted using a waveform, such as CP-OFDM, CP DFT-s-OFDM, UW OFDM, and/or UW DFT-s-OFDM.

NR-SSS may be implemented with a coded sequence.

FIG. 5 is an example of a transmission (e.g., a downlink (DL) transmission) of a coded sequence based NR-SSS. The transmission (e.g., a downlink (DL) transmission) of a coded sequence based NR-SSS may be performed by an gNB. One or more (e.g., a set of) known sequences may be determined and/or used, at 502. For example, the sequences may be determined and/or used to signal information carried by NR-SSS. At 504, an encoder may encode information into one or more (e.g., a combination of) sequences. One or more sequences or sequence segments may be selected, for example, based on information to be conveyed in NR-SSS. Selected sequences may be encoded, for example, using a channel encoder, e.g., a Polar Encoder using Polar codes, LDPC, TBCC, and/or the like. An encoded sequence may be scrambled, at 506. The encoded sequence may be modulated, at 508. The encoded sequence may be mapped to resources and/or subcarriers, at 510. The encoded sequence may be transmitted, at 512. For example, the encoded sequence may be transmitted in the SSS and/or the NR-PBCH. The encoded sequence may be transmitted using a waveform.

FIG. 6 is an example of WTRU actions that may be used to receive and/or decode a coded sequence based NR-SSS.

One or more transmitted sequences may be received. For example, one or more transmitted sequences may be received via a waveform, at 602. The sequences may be received, for example, by decoding a received coded sequence based NR-SSS. The sequences may be de-mapped, at 604. For example, the sequences may be de-mapped from the resources and/or subcarriers. The sequences may be demodulated, at 606 and/or descrambled, at 608. The sequences may be decoded, at 610, e.g., by a polar decoder. Recovered sequence(s) (e.g., decoded sequences) may be compared with pre-defined and/or pre-configured sequences. For example, recovered sequences may be compared with pre-defined and/or pre-configured sequences to determine (e.g., further decode) original information conveyed in NR-SSS, at 612. Examples of the sequences may include scrambling sequences, pseudo-random sequences, pseudo noise (PN) codes, and/or the like.

A table may map (e.g., decode) one or more (e.g., combinations of) sequences, sequence segments, or portions of one or more sequences to information conveyed by NR-SSS. For example, one or more sequences may indicate, for example, that information in NR-SSS pertains to a cell group and/or synchronization signal (SS) block. A cell group may be a cell. Example tables with example mappings may be provided in Table 1 (e.g., information encoded in NR-SSS sequence), Table 2 (e.g., information encoded in NR-SSS sequence combinations), Table 3 (e.g., information encoded in NR-PBCH scrambling sequence), and/or Table 4 (e.g., information encoded in NR-PBCH scrambling sequence):

TABLE 1

| Sequence Number | Information carried by NR-SSS |
|---|---|
| Sequence 1 | Cell group 1 |
| Sequence 2 | Cell group 2 |
| ... | ... |
| Sequence N | Cell group N |
| Sequence N + 1 | SS-Block 1 |
| ... | ... |
| Sequence N + K | SS-Block K |

TABLE 2

| Sequence Combinations | Information carried by NR-SSS |
|---|---|
| Sequence 1 and sequence 2 | Cell group 1 |
| Sequence 1 and sequence 3 | Cell group 2 |
| ... | ... |
| Sequence M − 1 and sequence M | Cell group N |
| Sequence M and sequence M + 1 | SS-Block 1 |
| ... | ... |
| Sequence M + L − 1 and sequence M + L | SS-Block K |

TABLE 3

| Sequence Number | System frame number (SFN) carried by NR-PBCH |
|---|---|
| Sequence 1 | SFN bits 000 |
| Sequence 2 | SFN bits 001 |
| ... | ... |
| Sequence 7 | SFN bits 110 |
| Sequence 8 | SFN bits 111 |

TABLE 4

| Sequence Number | Information carried by NR-PBCH |
|---|---|
| Sequence 1 | SFN bits: 000 and half radio frame bit: 0 |
| ... | ... |
| Sequence 8 | SFN bits: 111 and half radio frame bit: 0 |
| Sequence 9 | SFN bits: 000 and half radio frame bit: 1 |
| ... | ... |
| Sequence 16 | SFN bits: 111 and half radio frame bit: 1 |

Error checking may be provided with NR-SSS/NR-PBCH. A decoded sequence may be in error and/or may be decoded (e.g., mapped) inaccurately. A CRC may be attached to NR-SSS to provide (e.g., double) confirmation of a decoded sequence. A decoded sequence that may be found (e.g., in a table) may fail a CRC test. Synchronization may be declared a failure, for example, upon failure of a CRC test. Accumulation may occur, e.g., to enhance reliability, for example, until a decoded sequence is found (e.g., in a table) and passes a CRC test.

FIG. 7 is an example DL transmission of a coded sequence CRC-based NR-SSS/NR-PBCH.

The DL transmission of the coded sequence of a CRC-based NR-SSS/NR-PBCH may be performed by an gNB. One or more (e.g., a set of known) sequences may be determined and/or used, at 702. For example, a sequence of a CRC-based NR-SSS/NR-PBCH may be determined and/or used. At 704, a CRC may be attached to the NR-SSS/NR-PBCH. For example, if a data payload is not present, a CRC is attached to a sequence used in NR-SSS and/or NR-PBCH. If data payload is present, a CRC is attached to a sequence (scrambling) and data, or a CRC is attached to a scrambled data payload in NR-SSS and/or NR-PBCH. An encoder (e.g., a channel encoder, such as a Polar encoder using Polar Codes) may encode information into one or more (e.g., a combination of) sequences, at 706. One or more sequences may be selected, for example, based on information to be conveyed in the NR-SSS/NR-PBCH. An encoded sequence may be scrambled, at 708. The encoded sequence may be modulated, at 710. The encoded sequence may be mapped to resources and/or subcarriers, at 712. An encoded sequence may be transmitted, at 714. For example, the encoded sequence may be transmitted in the SSS and/or the NR-PBCH. The encoded sequence may be used to scramble the SSS and/or the NR-PBCH. The encoded sequence may be transmitted using a waveform.

FIG. 8 is an example for a WTRU to receive a coded sequence CRC-based NR-SSS/NR-PBCH. One or more transmitted sequences of CRC-based NR-SSS/NR-PBCHs may be received. For example, one or more transmitted sequences of CRC-based NR-SSS/NR-PBCHs may be received via a waveform, at 802. The sequences may be received, for example, by decoding a received coded sequence of CRC-based NR-SSS/NR-PBCHs. The sequences may be de-mapped, at 804. For example, the sequences may be de-mapped from the resources and/or subcarriers. The sequences may be demodulated, at 806 and/or descrambled, at 808. The sequences may be decoded, at 810, e.g., by a polar decoder. Recovered sequence(s) may be compared with pre-defined and/or pre-configured sequences, for example, to determine (e.g., further decode) original information conveyed in NR-SSS/NR-PBCH, at 812. Examples of the sequences may include scrambling sequences, pseudo-random sequences, pseudo noise (PN) codes, and/or the like. The sequences may be tested, e.g., via a CRC test, at 814. At 816, the sequences may be recovered. For example, the originally transmitted sequences may be recovered. The sequences may be recovered, for example, if the sequences pass the CRC test.

A data and coded sequence based (e.g., a hybrid data and coded sequence based) NR-SSS/NR-PBCH may be provided. The hybrid data and coded sequence based NR-SSS/NR-PBCH may use data and/or coded sequence(s). For example, hybrid data and a coded sequence may combine data and a coded sequence jointly using scrambling. For example, a coded sequence may be used to scramble the data. Hybrid data and a coded sequence may combine data and a coded sequence jointly, for example, using attachment. A coded sequence may carry synchronization information, for example, timing information, cell ID, etc. A Cell ID may determine a scrambling sequence (e.g., a long scrambling sequence) and timing information may determine a segment or a portion of the scrambling sequence. Timing information may be used to determine a scrambling sequence or a sequence segment. Timing information may be part of data. The hybrid data and coded sequence based NR-SSS/NR-PBCH may use data and/or coded sequence(s) to carry a SYNC/PBCH payload for NR-SSS or NR-PBCH.

Figure 9:
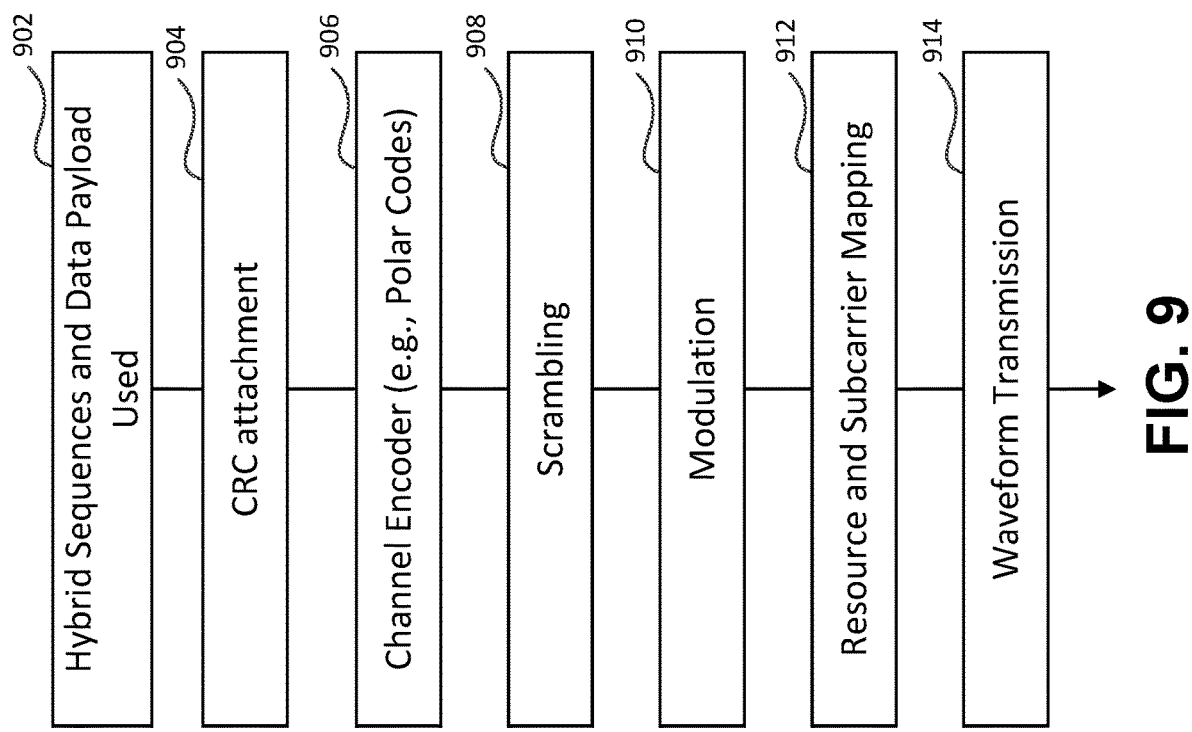
FIG. 9 is an example of a hybrid data and coded sequence based NR-SSS or NR-Physical Broadcast Channel (PBCH).

FIG. 9 is an example of a hybrid data and coded sequence based NR-SSS. The hybrid data and coded sequence based NR-SSS may be performed by a gNB. One or more (e.g., a set of) hybrid sequences and/or data payloads may be determined and/or used, at 902. Error check bits (e.g., CRC bits) may be attached to hybrid sequences and/or a data payload, for example, at 904. Examples of the sequences may include scrambling sequences, pseudo-random sequences, pseudo noise (PN) codes, and/or the like. The sequences may be used to scramble data payload for a hybrid sequence and/or a payload approach. For example, a PBCH payload may be scrambled using a sequence, a sequence segment, or a portion of a sequence or sequences. Such sequence(s) may be based on a cell ID and/or timing information. Initialization of scrambling sequences may depend on cell ID and/or timing information. Initialization of scrambling sequences may be based on a cell ID and/or timing information. Timing information may be a system frame number, a subset of system frame number bits (e.g., X bits least significant bits (LSB), X may be 1, 2, 3, etc.), a half radio frame number or bit, an SS block index or SS block time index (e.g., 2, 3 bits), etc.

Error check bits may include, for example, CRC bits. Error check bits may be attached to the scrambled data payload and/or timing information in a hybrid approach. Timing information may be scrambled. Timing information may not be scrambled. For example, a set or subset of timing information may be used to determine a scrambling sequence and/or a sequence segment. The set or subset of timing information may be used to determine a scrambling sequence and/or a sequence segment while another set or subset of timing information may not be used to determine scrambling sequence or sequence segment. Timing information used to determine a scrambling sequence or a sequence segment may not be scrambled. Timing information not used to determine a scrambling sequence or a sequence segment may be scrambled. Resulting hybrid sequences and data SYNC or PBCH payload with error check bits or CRC may be encoded, for example, using a channel encoder, e.g., a Polar Encoder using Polar codes, at 906. An encoded SYNC or PBCH payload may be scrambled, at 908. The encoded SYNC or PBCH payload may be modulated, at 910. The encoded SYNC or PBCH payload may be mapped to resources and subcarriers, at 912. The encoded SYNC or PBCH payload may be transmitted, at 914. The encoded SYNC or PBCH payload may be transmitted using a waveform, such as CP-OFDM, CP DFT-s-OFDM, UW OFDM, and/or UW DFT-s-OFDM. The scrambling (e.g., scrambling sequence) may be used for data payload and/or may be before channel encoding. The scrambling (e.g., scrambling sequence) may be before CRC attachment. The scrambling (e.g., scrambling sequence) may be after CRC attachment. The scrambling (e.g., scrambling sequence) may be before the channel encoder.

Figure 10:
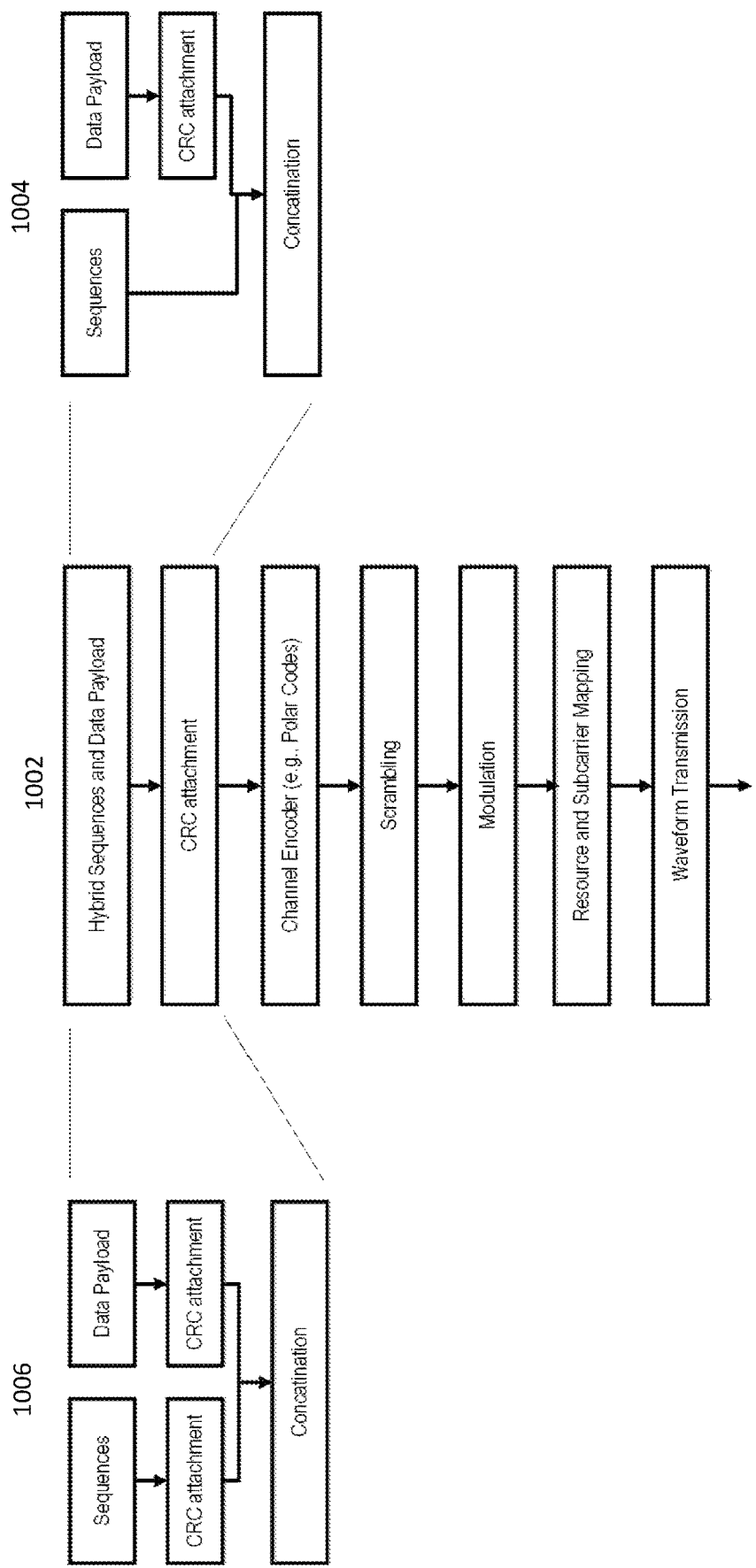
FIG. 10 is an example of a hybrid data and coded sequence based NR-SSS or NR-PBCH.

FIG. 10 is an example of a hybrid data and coded sequence based NR-SSS or NR-PBCH. FIG. 10 presents examples, e.g., 1002, 1004, and 1006. In an example, a SYNC payload (e.g., the same or different) may be carried (e.g., carried separately) by coded sequences and/or a data payload. A SYNC payload may refer (e.g., may be referred) to timing information (e.g., a system frame number (SFN), a part of an SFN, and/or a half radio frame number). For example, part of SFN bits may be carried by a sequence. For example, the same part of SFN bits may be carried by a sequence and/or data payload. For example, part of SFN bits may be carried by sequence. A part (e.g., a different part) of SFN bits may be carried in a data payload. Sequence and/or data payloads may be attached (e.g., separately attached) with error check bits, as shown in 1006. The data payload may be scrambled, for example, using a sequence. The scrambled data payload and/or the unscrambled timing information may be attached with CRC. In an example, error check bits may not be attached to a sequence, as shown in 1004. Error check bits may include, for example, CRC bits. A resulting sequence and data payload with error check bits or CRC may be concatenated or XOR-ed. The concatenated or XOR-ed sequence and data SYNC payload with CRC attachment(s) may be encoded, for example, using a channel encoder, e.g., Polar codes. The encoded SYNC payload may be scrambled, modulated, and/or mapped to resources and/or subcarriers and/or may be transmitted using a waveform, such as CP-OFDM, CP DFT-s-OFDM, UW OFDM, and/or UW DFT-s-OFDM.

Figure 10A:
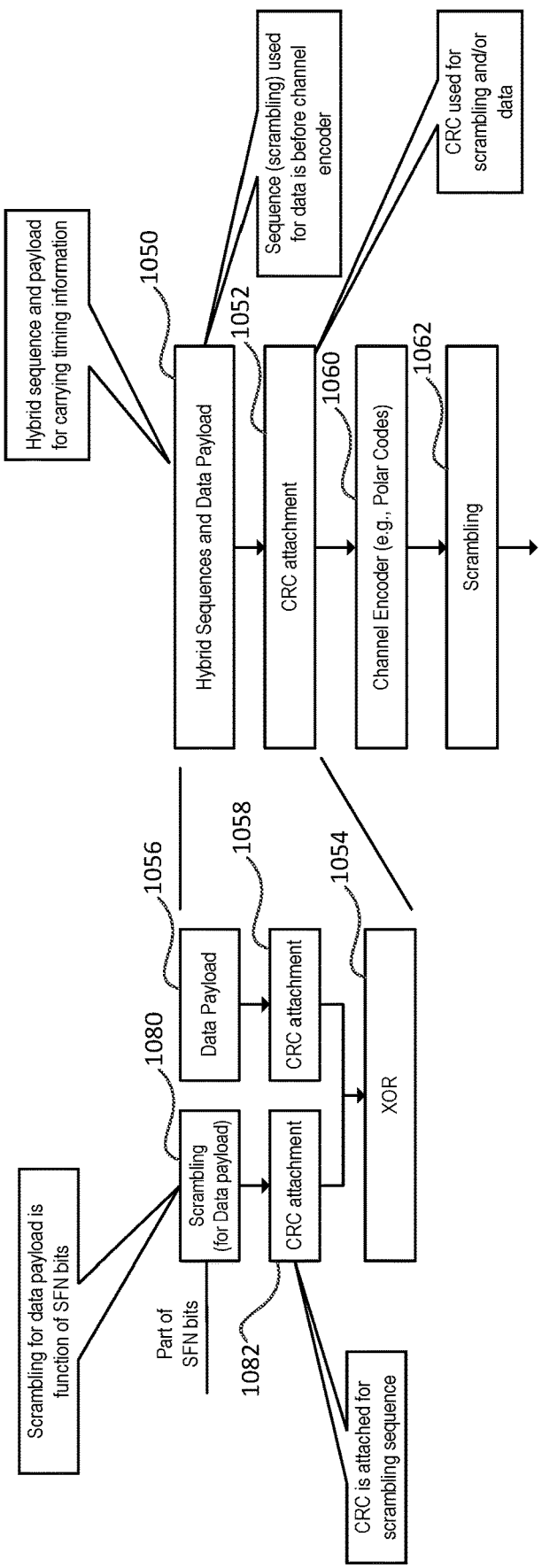
FIG. 10A is an example of a hybrid data and coded sequence based NR-SSS or NR-PBCH.

FIG. 10A is an example of a hybrid data and coded sequence based NR-SSS or NR-PBCH. A sequence (e.g., a scrambling sequence) may be used to scramble a data payload, at 1050. Timing information, such as part of SFN bits, may be carried by the sequence (e.g., the scrambling sequence). The sequence (e.g., the scrambling sequence) may be used for scrambling the data payload before encoding (e.g., encoding via a channel encoder) is performed. CRC may be attached to scrambling sequence and/or data payload, at 1052. For example, data payload and/or scrambling sequence may be attached with CRC. A data payload and/or scrambling sequence, for example, may each be attached with a CRC. The CRC that is attached for a scrambling sequence and the CRC that is attached for data may be different. The scrambled data may be attached with a composite CRC. For example, data may be scrambled with a scrambling sequence and/or a CRC (e.g., a single CRC) may be attached to the resulting scrambled data. The composite CRC may be a combination of the CRC attached for a scrambling sequence and the CRC attached for data. Outputs (e.g., the resulting outputs, such as the outputs after CRC attachment) may be XOR-ed, at 1054, added, and/or modulo-ed by 2. Data payload (e.g., data payload 1056) may be scrambled, at 1080. For example, a data payload may be scrambled using a scrambling sequence. Scrambling of the data payload may be based on SFN bits or a subset of SFN bits. The scrambled data payload may be attached with CRC (e.g., CRC bits), at 1082. The data payload may be attached with CRC (e.g., CRC bits), at 1058. The CRC attached scrambled data payload may be encoded, at 1060. For example, the CRC attached scrambled data payload may be encoded using a channel encoder (e.g., a Polar encoder using Polar codes). The encoded bits may be scrambled, at 1062. For example, the encoded bits may be scrambled using the same or another scrambling sequence (e.g., a scrambling sequence that may be the same or different from the scrambling performed at 1062). For example, the scrambling sequence may be determined (e.g., initialized) by a cell ID. The encoded bits may be scrambled, for example, using segments (e.g., different segments) or portions of the long scrambling sequence determined by the cell ID. The segment or portion of the long scrambling sequence may be determined by timing information (e.g., another timing information, such as an SS block index). The segments (e.g., different segments) or portions of the long scrambling sequence may be overlapped or non-overlapped with one other.

A hybrid sequence and data payload based approach for an NR-PBCH may be implemented.

Figure 11:
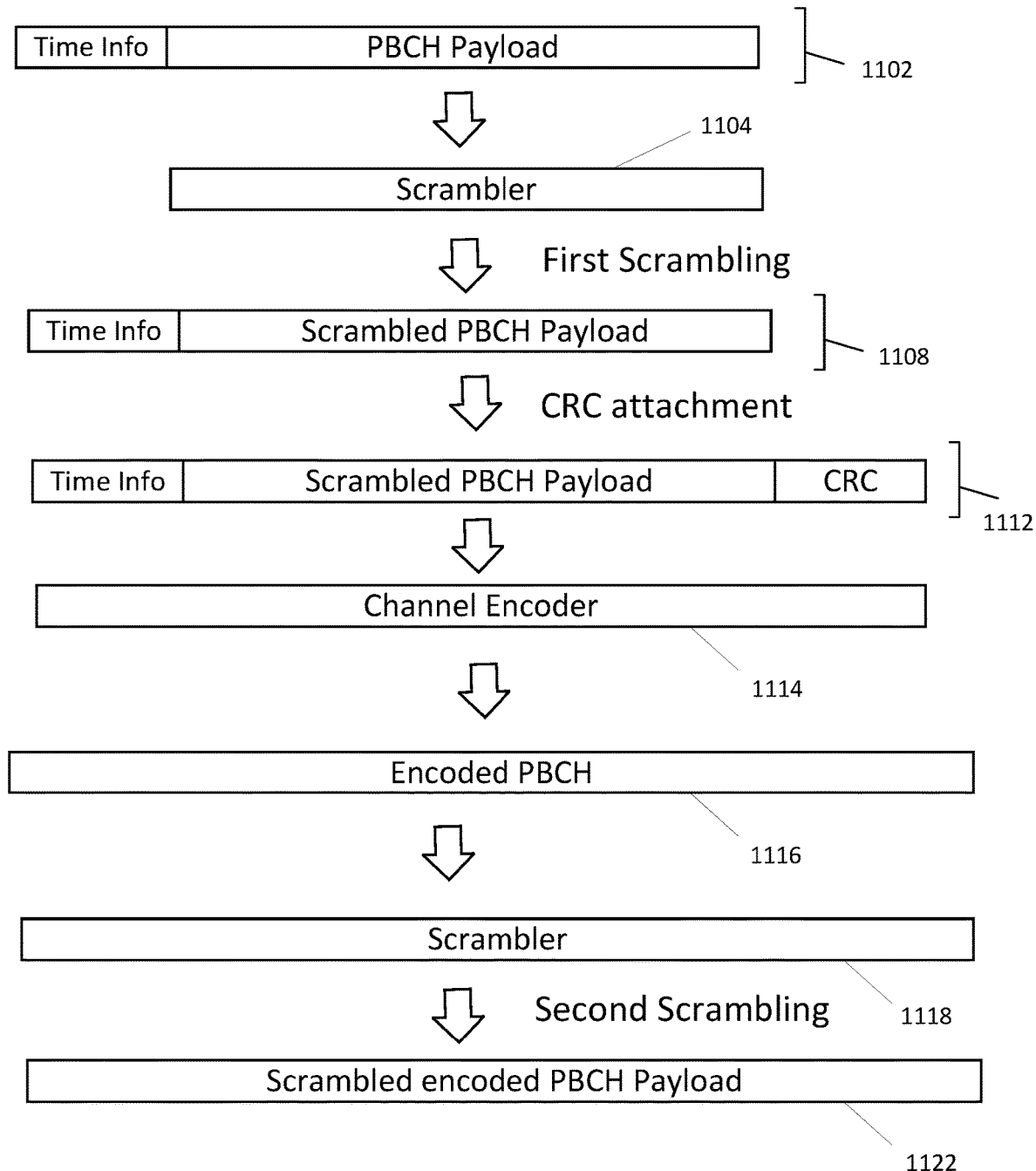
FIG. 11 is an example of a hybrid data and sequence based NR-PBCH.

FIG. 11 is an example of a hybrid data payload and sequence based NR-PBCH. Information associated with a PBCH (e.g., an NR-PBCH) may be provided (e.g., received, determined, and/or generated, etc.), at 1102. For example, such information may include a PBCH payload (e.g., data to be transmitted on the PBCH) and timing information. The PBCH payload may be scrambled via scrambler 1104. The PBCH payload may be scrambled using one or more sequences, sequence segments, or portions of one or more sequences (e.g., one or more scrambling sequences, scrambling sequence segments, or portions of one or more scrambling sequences). A scrambling sequence may be based on (e.g., a function of) a cell ID and/or timing information. For example, initialization of a sequence (e.g., one or more scrambling sequences) may be based on cell ID and/or timing information. Timing information may not be scrambled (e.g., the timing information shown at 1102 may not be scrambled at 1104). The scrambled PBCH payload and the timing information (e.g., unscrambled timing information) may result, at 1108. Timing information may be a system frame number, a subset (e.g., part) of system frame number bits, half radio frame number or bit, SS block index or time index, etc. The scrambled PBCH payload and/or the timing information (e.g., the unscrambled timing information) may be attached with CRC, at 1112. The timing information (e.g., the unscrambled timing information), scrambled PBCH payload, and/or CRC may be encoded using a channel encoder, at 1114. The encoding of the timing information, scrambled PBCH payload, and/or CRC may be performed using Polar codes. The result of the channel encoding at 1114 may be an encoded PBCH, shown at 1116. The encoded PBCH may be scrambled, via Scrambler 1118. For example, the encoded PBCH may be scrambled using a (e.g., another) sequence, sequence segment, or a portion of one or more sequences. The other sequence may be based on a cell ID and/or timing information. The scrambled encoded PBCH payload (e.g., NR-PBCH payload) may result, at 1122. If a scrambling sequence (e.g., the same scrambling sequence) is used, the segment or portion of the scrambling sequence may be determined by another timing information (e.g., an SS block index). The determined segment or portion of the scrambling sequence may be used to scramble the encoded PBCH.

Figure 12:
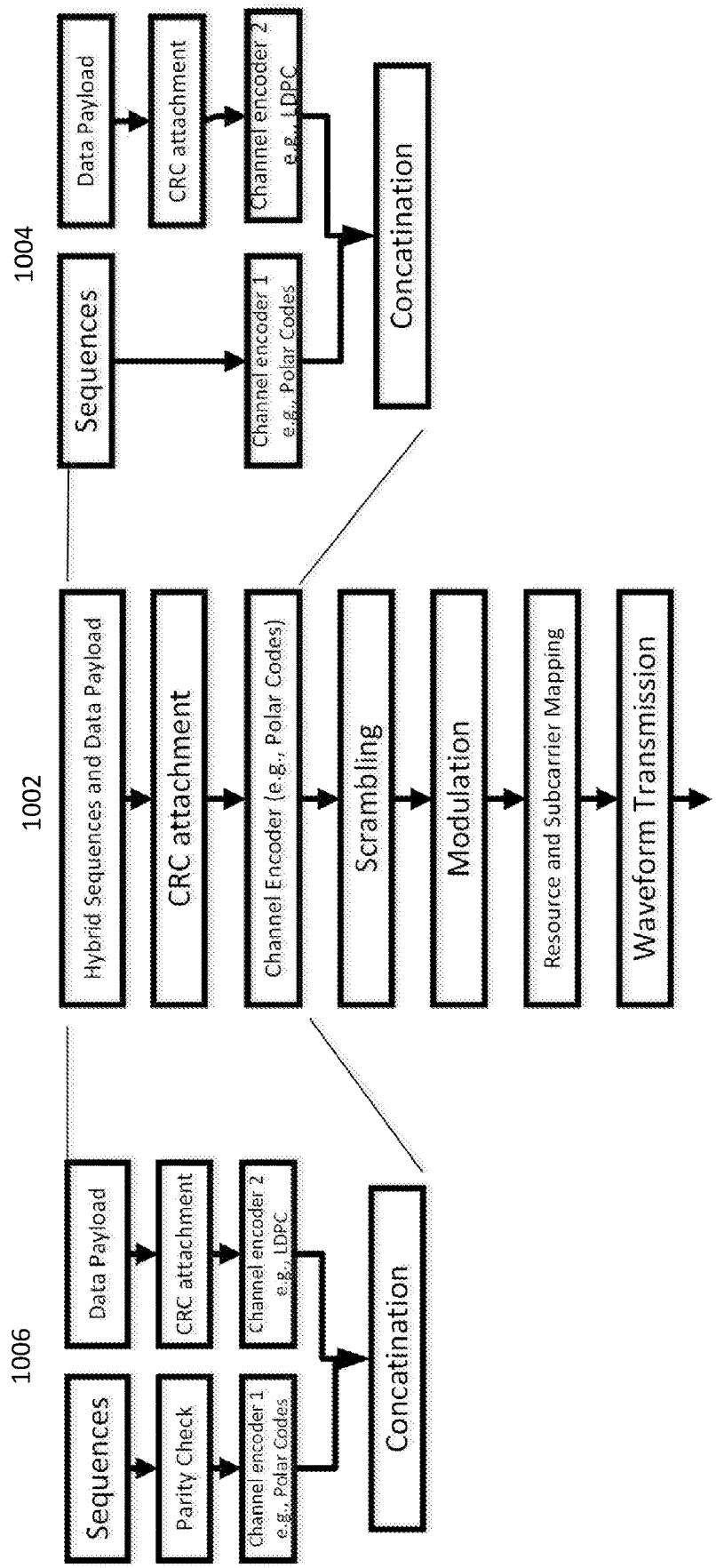
FIG. 12 is an example of a hybrid data and coded sequence based NR-SSS or NR-PBCH.

FIG. 12 is an example of a hybrid data and coded sequence based NR-SSS. FIG. 12 presents several examples, e.g., 1202, 1204, and 1206. In an example, a SYNC payload may be carried (e.g., carried separately) by coded sequences and/or a data payload. Sequences and/or data payloads may be attached (e.g., jointly attached with single CRC as in 1202 or separately attached with multiple CRCs as in 1204 and/or 1206) with a parity check and/or CRC, as shown in 1206. In an (e.g., alternative) example, error check bits may not be attached to a sequence, as in 1204. Resulting sequences and/or a data payload with error check bits or CRC may be encoded (e.g., separately encoded) similarly (e.g., the same) or differently, e.g., with the same or different channel codes. For example, a sequence based SYNC payload may be encoded by Polar codes. A data bearing based SYNC payload may be encoded by LDPC.

The coded SYNC payloads may be concatenated or XOR-ed, scrambled, modulated, and/or mapped to resources and subcarriers and/or transmitted using a waveform, such as CP-OFDM, CP DFT-s-OFDM, UW OFDM, and/or UW DFT-s-OFDM.

A reference signal may be provided for an error check-based synchronization signal. In an example, an error check-based synchronization signal may use a reference signal, such as a dedicated reference signal (DRS) or a demodulation reference signal (DMRS), for self-demodulation. A reference signal (e.g., DRS or DMRS) may be, for example, embedded within an error check-based synchronization signal. An allocation of a reference signal (e.g., DRS or DMRS) may be, for example, distributed within resources that may be occupied by an error check-based synchronization signal.

FIG. 13 is an example of an error check-based synchronization signal for SSS. An error check-based synchronization signal may be used, for example, for an SSS (e.g., an NR-SSS). FIG. 13 shows an example of a synchronization signal consisting of hybrid synchronization signals including, for example, correlation-based PSS 1304 and non-correlation-based SSS 1302. In an example, PSS 1304 may be a sequence-based synchronization signal. SSS 1302 may be an error check-based synchronization signal. DRS or DMRS may be used in SSS 1302 and not used in PSS 1304.

FIG. 14 is an example of an error check-based synchronization signal for another synchronization signal (OSS). In an example, an error check-based synchronization signal may (e.g., may also) be used for one or more OSSs 1402. FIG. 14 shows an example of a synchronization signal comprising multiple mixed synchronization signals including, for example, PSS 1406, SSS 1404, and/or OSS 1402. In an example, PSS 1406 and SSS 1404 may be sequence-based synchronization signals. OSS 1402 may be an error check-based synchronization signal. A reference signal (e.g., DRS or DMRS) may be used in OSS 1402 and not used in PSS 1406 and SSS 1404.

Figure 15:
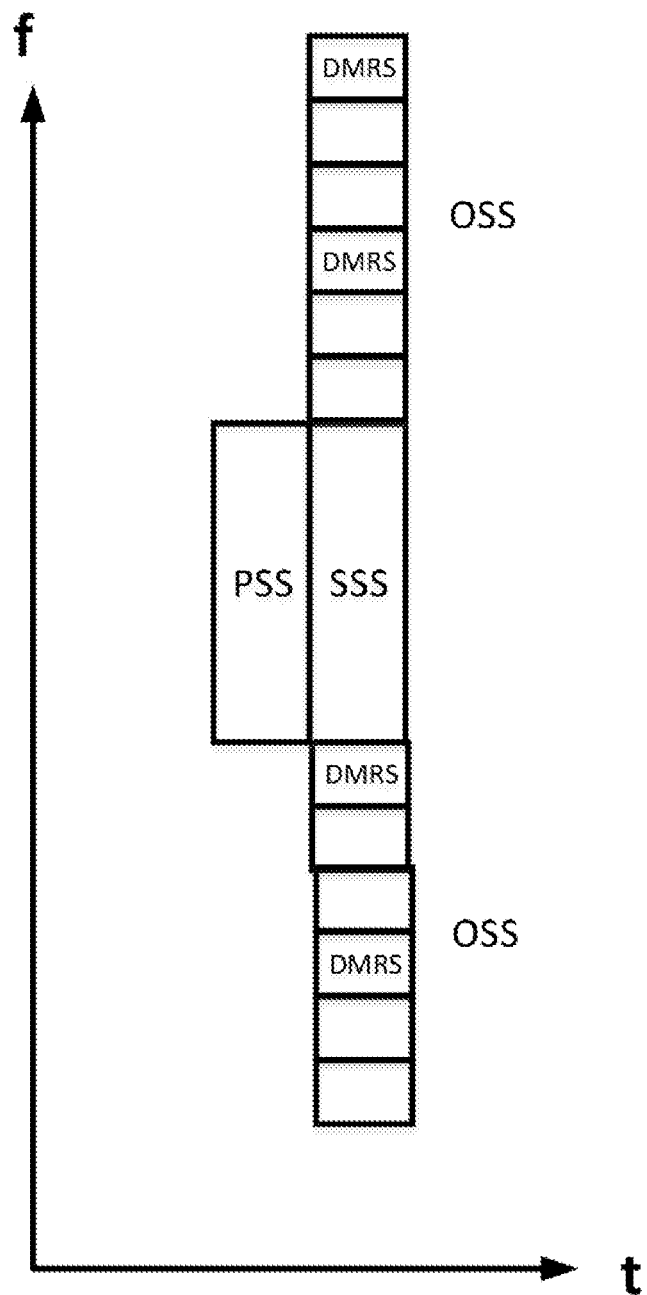
FIG. 15 is an example of an error check-based synchronization signal for OSS.

FIG. 15 is an example of an error check-based synchronization signal for OSS.

Figure 16:
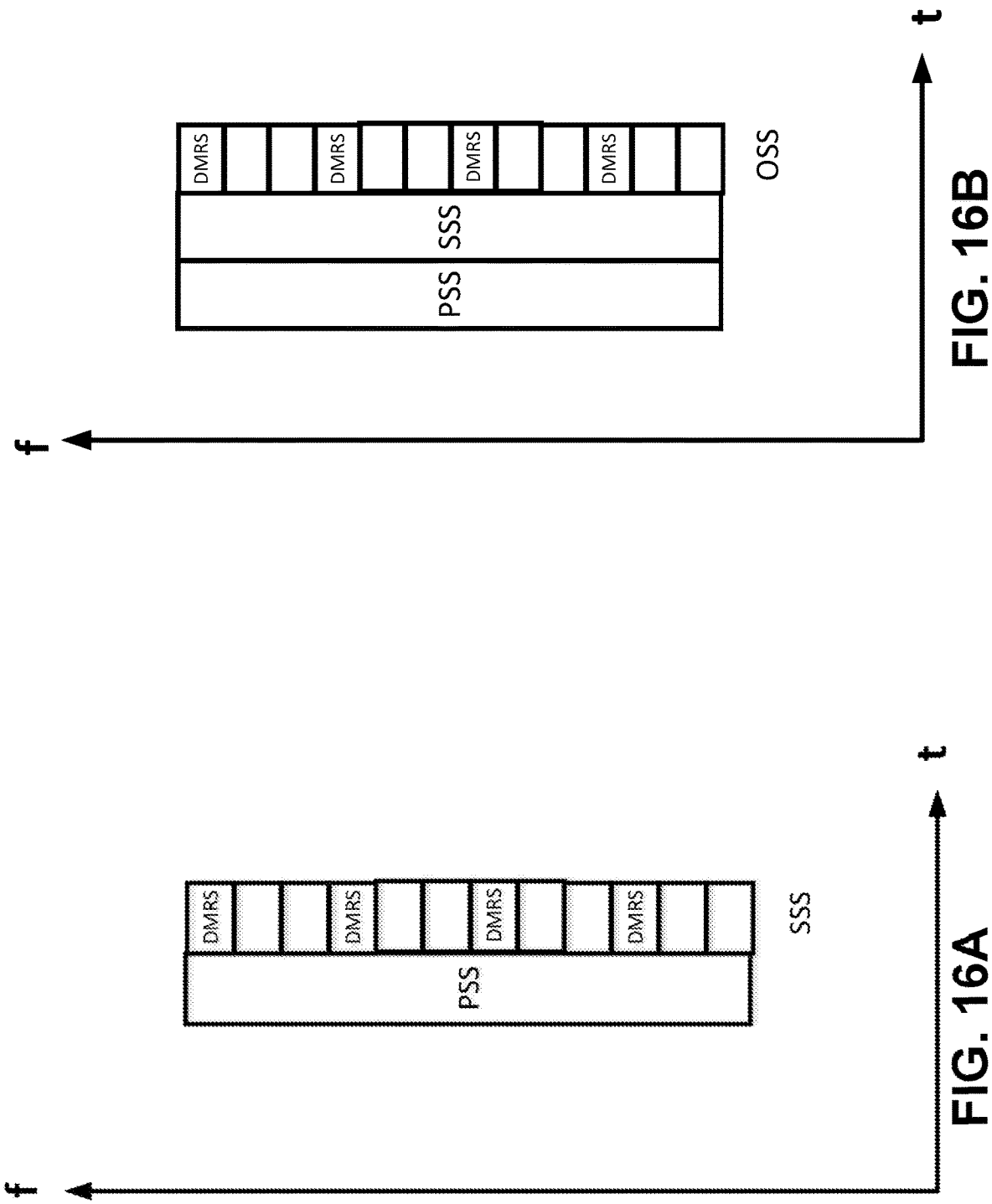
FIG. 16A is an example of an error check-based synchronization signal for Primary Synchronization Signal (PSS)/SSS.
FIG. 16B is an example of an error check-based synchronization signal for PSS/SSS/OSS.

FIG. 16A is an example of an error check-based synchronization signal for PSS/SSS.

FIG. 16B is an example of an error check-based synchronization signal for PSS/SSS/OSS.

A bandwidth for an error check-based synchronization signal may be the same as, or different from, a correlation-based synchronization signal. FIGS. 13 and 14 show different example bandwidth implementations. FIGS. 16A and 16B show a same bandwidth implementation. In an example, an error check-based synchronization signal may employ a wider bandwidth than a correlation-based PSS (e.g., as shown by example in FIG. 13) or a correlation-based PSS/SSS (e.g., as shown by example in FIG. 14). FIGS. 16A and 16B show examples with the same bandwidth for PSS/SSS and PSS/SSS/OSS.

An SSS may be sequence-based. A sequence d(0), . . . , d(N−1), which may be used for a second synchronization signal, may be a length-N binary sequence that may be scrambled, for example, with a scrambling sequence that may be provided by a primary synchronization signal. An example is presented in accordance with Eq. 3:

$$d(n)=z_j^{(m0)}(n)v^{(m1)}(n), n=0,1,\ldots,N-1 \quad \text{Eq. 3}$$

Sequence $z_j^{(m0)}(n)$ in Eq. 3 may be defined as a cyclic shift of an m-sequence $z_j(n)$ based on, for example, Eq. 4:

$$z_j^{(m0)}(n)=z_j((n+m0) \bmod N) \quad \text{Eq. 4}$$

where, for example, $z_1(l)$ may be in accordance with Eq. 5:

$$z_j(l)=1-2x(l) \quad \text{Eq. 5}$$

In an example, l may be defined by $0 \leq l \leq N-1$; N may be 127; j may be 0, 1, 2; x(l) may be 0 or 1; and/or $z_j(n)$ may be defined by polynomial, for example:

$z_1(n)$ may be defined by a polynomial, e.g., $x^7+x+1$;

$z_2(n)$ may be defined by a polynomial, e.g., $x^7+x^3+1$;

$z_3(n)$ may be defined by a polynomial, e.g., $x^7+x^5+1$;

$z_1(n)$ may be implemented, for example, by $x(l+7)=(x(l+1)+x(l))\bmod 2$;

$z_2(n)$ may be implemented, for example, by $x(l+7)=(x(l+3)+x(l))\bmod 2$;

$z_3(n)$ may be implemented, for example, by $x(l+7)=(x(l+5)+x(l))\bmod 2$;

or $z_1(n)$ may be defined by a polynomial, e.g., $x^7+x+1$;

$z_2(n)$ may be defined by a polynomial, e.g., $x^7+x^3+1$;

$z_3(n)$ may be defined by a polynomial, e.g., $x^7+x^4+1$;

$z_1(n)$ may be implemented, for example, by $x(l+7)=(x(l+1)+x(l))\bmod 2$;

$z_2(n)$ may be implemented, for example, by $x(l+7)=(x(l+3)+x(l))\bmod 2$;

$z_3(n)$ may be implemented, for example, by $x(l+7)=(x(l+4)+x(l))\bmod 2$;

and initial conditions may be, e.g., $x(0)=0, x(1)=0, x(2)=0, x(3)=0, x(4)=0, x(5)=0, x(6)=1$.

Scrambling sequence $v^{(m1)}(n)$ in Eq. 3 may be used, for example, to scramble a secondary synchronization signal. Sequence $v^{(m1)}(n)$ may depend on a primary synchronization signal. Sequence $v^{(m1)}(n)$ may be defined as a cyclic shift of the m-sequence v(n), for example, in accordance with Eq. 6:

$$v^{(m1)}(n)=v((n+m1) \bmod N) \quad \text{Eq. 6}$$

where, for example, v(l) may be in accordance with Eq. 7:

$$v(l)=1-2x(l) \quad \text{Eq. 7}$$

In an example, l may be defined by $0 \leq l \leq N-1$, N may be 127, and v(n) may be defined by a polynomial, for example:

v(n) may be defined by a polynomial, e.g., $x^7+x^5+x^3+x+1$;

v(n) may be implemented, e.g., by $x(l+7)=(x(l+5)+x(l+3)+x(l+1)+x(l))\bmod 2$;

or v(n) may be defined by a polynomial, e.g., $x^7+x^3+x^2+x+1$;

v(n) may be implemented, e.g., by $x(l+7)=(x(l+3)+x(l+2)+x(l+1)+x(l))\bmod 2$;

and initial conditions may be, e.g., $x(0)=0, x(1)=0, x(2)=0, x(3)=0, x(4)=0, x(5)=0, x(6)=1$.

A physical-layer cell identity group $N_{ID}^{(1)}$ may be defined or mapped, for example, by Eq. 8:

$$N_{ID}^{(1)}=jN+m0 \quad \text{Eq. 8}$$

where, for example, j=0, 1, 2 and $0 \leq m0 \leq N-1$.

$N_{ID}^{(2)}$ may be a physical-layer identity within a physical-layer cell identity group $N_{ID}^{(1)} \cdot N_{ID}^{(2)}$ may be defined or mapped, for example, by Eq. 9:

$$N_{PCI}=3N_{ID}^{(1)}+N_{ID}^{(2)} \quad \text{Eq. 9}$$

In an example, a final physical layer cell ID may be mapped, e.g., by parameters j, m0, and m1, for example, based on Eq. 10:

$$N_{PCI}=3(jN+m0)+m1 \quad \text{Eq. 10}$$

where, for example, $0 \leq m1 \leq 2$.

Figure 17:
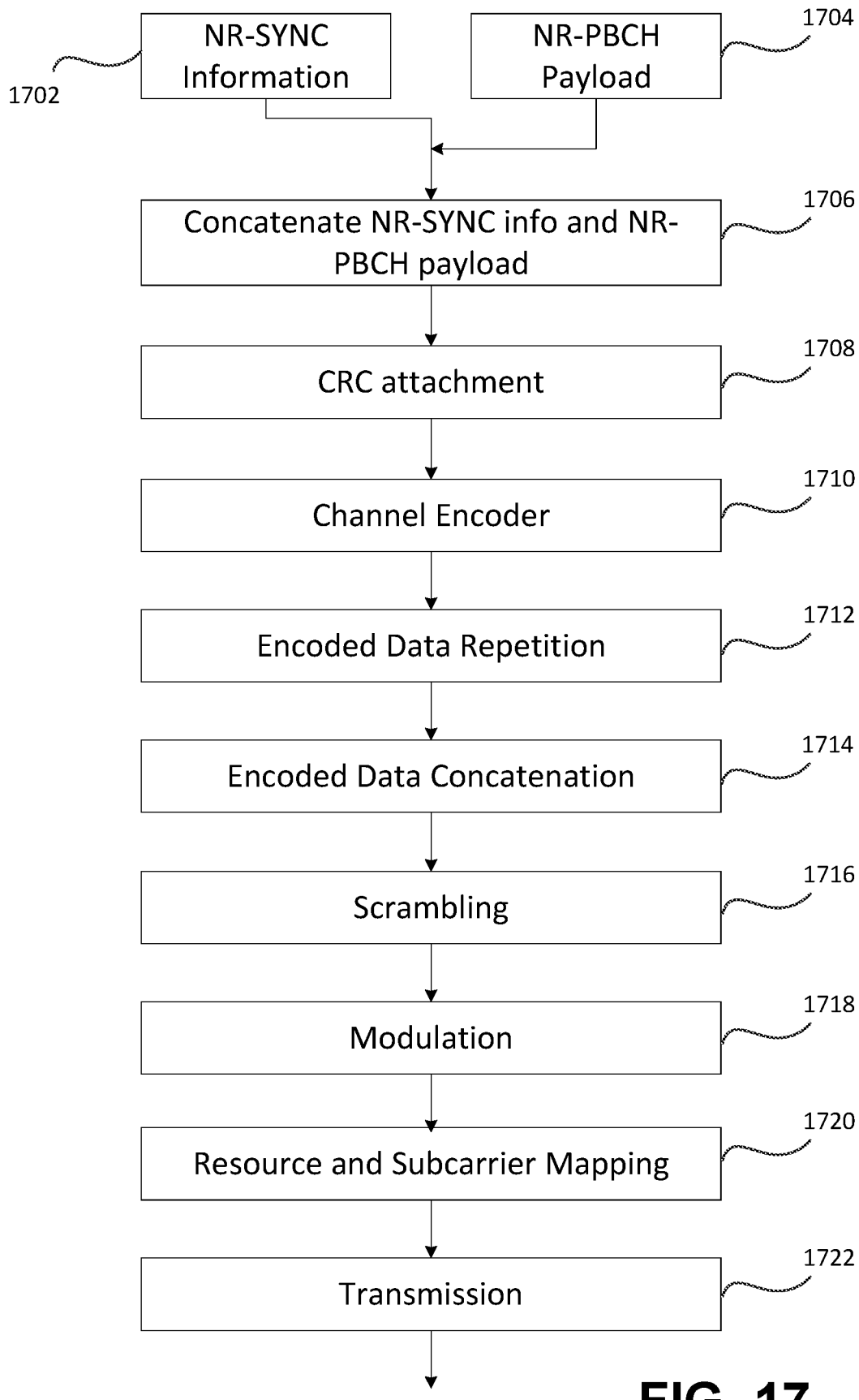
FIG. 17 is an example of an NR-Synchronization Broadcast Channel (SBCH).

FIG. 17 is an example of a synchronization channel design, for example, a New Radio Synchronization Broadcast Channel (NR-SBCH) design. A joint signal/channel, referred to as NR-SBCH, may comprise, for example, synchronization information (e.g., NR-SYNC information, such as information carried by a New Radio Secondary Synchronization Signal (NR-SSS)) 1702 and a New Radio Physical Broadcast Channel (NR-PBCH) payload 1704. The NR-SBCH design may combine the synchronization signal and the broadcast channel payload, for example, into a single synchronization broadcast signal/channel (e.g., into a single information payload). Synchronization information and a broadcast channel payload may be generated. For example, the generated synchronization information and the broadcast channel payload may be concatenated or XOR-ed, at 1706. The generated synchronization information and the broadcast channel payload may be concatenated or XOR-ed into a payload (e.g., a single and/or large information payload). The concatenated or XOR-ed payload may be concatenated with CRC bits. The concatenated or XOR-ed payload may be attached with CRC bits, at 1708. The concatenated, XOR-ed, and/or scrambled payload and CRC bits may be encoded, at 1710. For example, the concatenated, XOR-ed, and/or scrambled payload and CRC bits may be encoded using a channel encoder. Channel encoding may be, for example, LDPC, Polar code, Turbo code, and/or TBCC. Encoded information may be repeated, at 1712. The repeated coded bits may be concatenated, at 1714. The repeated and/or concatenated coded bits may be scrambled, at 1716. The repeated and/or concatenated coded bits may be modulated, at 1718. The repeated and/or concatenated coded bits may be mapped to resources and/or subcarriers, at 1720. The repeated and/or concatenated coded bits may be may be transmitted, at 1722. For example, the repeated and/or concatenated coded bits may be transmitted using a waveform, such as CP-OFDM, CP DFT-s-OFDM, UW OFDM, and/or UW DFT-s-OFDM.

Figure 18:
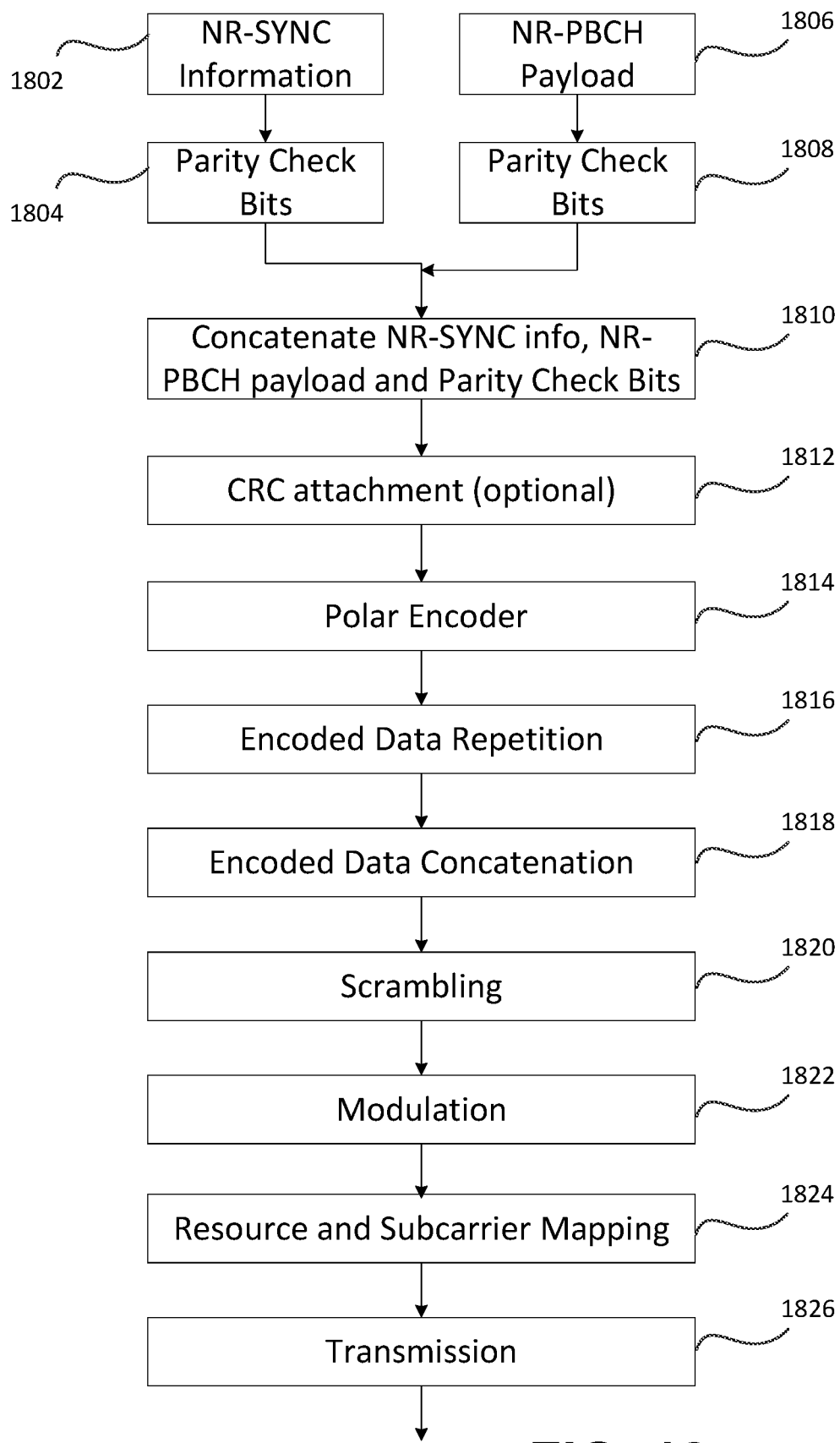
FIG. 18 is an example of a Polar Code based NR-SBCH.

FIG. 18 is an example of a Polar Code based NR-SBCH. Joint synchronization information (e.g., NR-SYNC information, such as NR-SSS) 1802 and NR-PBCH signal/channel 1806 may be implemented with a Polar code, which may be referred to as a Polar Code based new radio synchronization broadcast channel (Polar code based NR-SBCH). A synchronization signal and broadcast channel may be combined into a synchronization broadcast signal/channel, for example, using a Polar code. The synchronization information and broadcast channel payloads may be generated. Parity check bits (e.g., separate individual parity check bits) may be attached (e.g., separately attached) to synchronization information and a broadcast channel payload (e.g., each of the generated synchronization information and broadcast channel payload). For example, parity check bits may be attached with synchronization information, at 1804. Parity check bits may be attached with NR-PBCH payload, at 1808. The synchronization information (e.g., with parity check-bits) and/or broadcast channel payload (e.g., with parity check bits) may be concatenated or XOR-ed (or scrambled), at 1810. For example, the synchronization information (e.g., with parity check-bits) and/or broadcast channel payload (e.g., with parity check bits) may be concatenated or XOR-ed (or scrambled) into an information payload (e.g., a single information payload with parity check bit additions). CRC bits may (e.g., may optionally) be attached to the concatenated or XOR-ed (or scrambled) information, payload, and/or parity check bits, at 1812. Priority for synchronization information and/or broadcast payload may be prioritized, for example, using Polar encoder bit channels with proper priorities. The concatenated or XOR-ed (or scrambled) information, payload, parity check bits, and/or (e.g., optionally) CRC bits may be encoded, at 1814. For example, the concatenated or XOR-ed (or scrambled) information, payload, parity check bits, and/or (e.g., optionally) CRC bits may be encoded using a Polar encoder. The Polar encoded information bits may be repeated, at 1816. The repeated Polar coded bits may be concatenated, at 1818. The repeated and/or concatenated Polar coded bits may be scrambled, at 1820. The repeated and/or concatenated Polar coded bits may be modulated, at 1822. The repeated and/or concatenated Polar coded bits may be mapped, at 1824. For example, the repeated and/or concatenated Polar coded bits may be mapped to resources and subcarriers. The repeated and/or concatenated Polar coded bits may be transmitted, at 1826. For example, the repeated and/or concatenated Polar coded bits may be transmitted using a waveform, such as to CP-OFDM, CP DFT-s-OFDM, UW OFDM, and/or UW DFT-s-OFDM.

Figure 19:
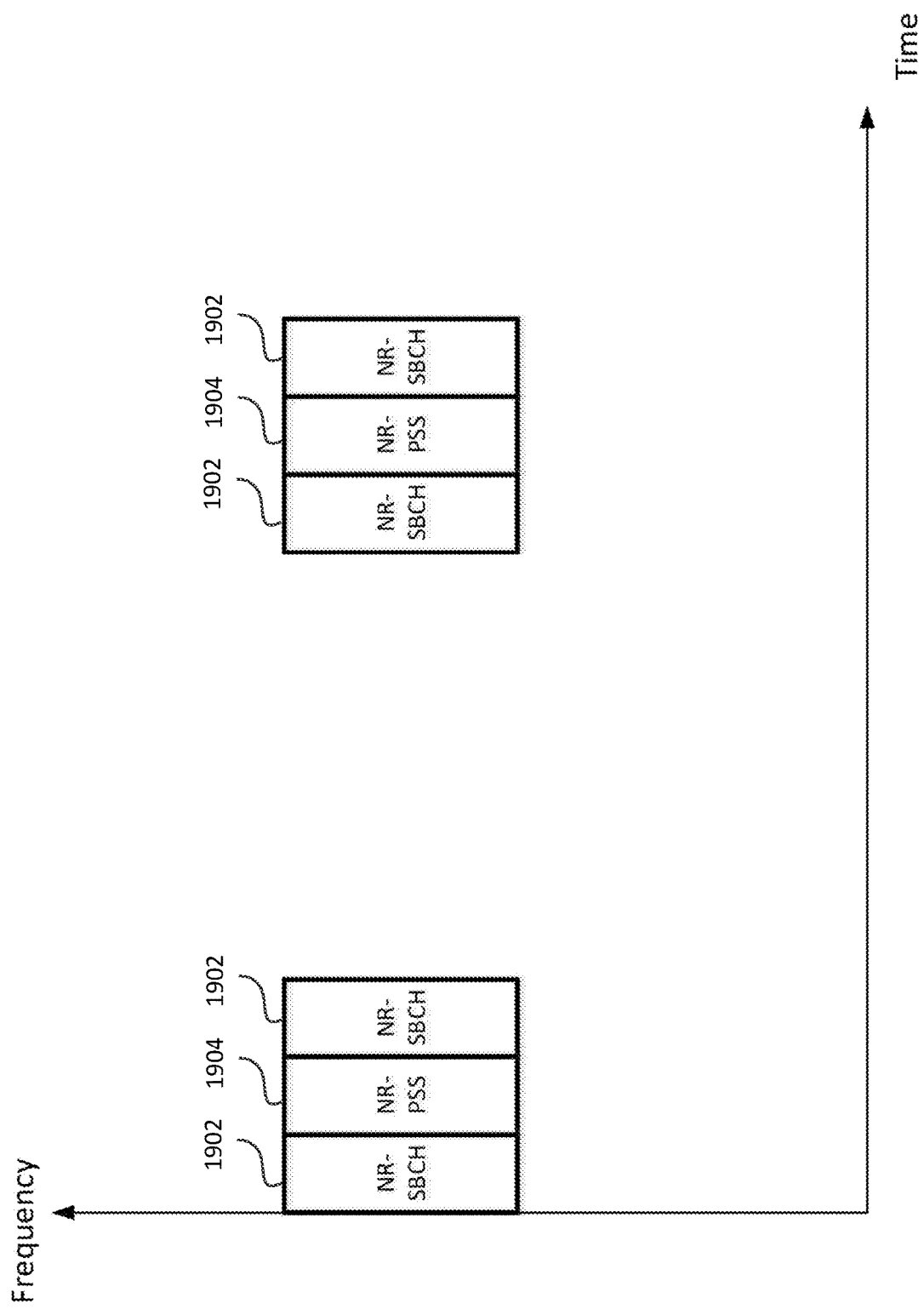
FIG. 19 is an example of an NR-SBCH multiplexing in time/frequency domains.

FIG. 19 is an example of an NR-SBCH multiplexing in time/frequency domains. In an example, an NR-SBCH may be repeated (e.g., repeated twice) in the time domain. The repeated NR-SBCHs 1902 may be placed relative to (e.g., one before and one after) NR-PSS 1904, for example, as shown in FIG. 19. Repeated NR-SBCHs may be used, for example, for carrier frequency offset estimation and/or correction. NR-SBCH and NR-PSS may (e.g., may alternatively) be repeated over frequency, for example, to improve robustness of signal detection and reduce latency (e.g., at a cost of increased minimum bandwidth). NR-PSS may be used, for example, as a reference signal for channel estimation and decoding of NR-SBCH.

A Synchronization Signal (SS)-block Index and/or Cell ID Indication/Detection may be provided, e.g., in NR.

In an example, a physical cell identity (PCI), $N_{PCI}$, may be defined, for example, according to Eq. 11:

$$N_{PCI}=N2\times N_{GID}+N_{CID} \qquad \text{Eq. 11}$$

$N_{GID}$ may be a physical layer cell identity group (e.g., 0 to N1−1), which may be provided by SSS. $N_{CID}$ may be an identity within the group (e.g., 0 to N2−1), which may be provided by PSS. The arrangement may create N1×N2 unique physical cell identities. For example (e.g., in LTE), N1 and N2 may be specified as 168 and 3, respectively.

FIG. 20 is an example of a (e.g., an LTE) synchronization. The synchronization may be used for NR, for example, with definitions of N1 and N2 parameters.

NR-PSS may detect symbol timing synchronization and a Cell ID, at 2002. For example, the Cell ID (e.g., the Cell ID within the cell group) may be referred to as N2. NR-SSS may detect a frame timing synchronization and a Cell group ID, at 2004. For example, the Cell group ID may be referred to as N1. The features of 2002 and 2004 may be combined. For example, the frame timing synchronization and the physical Cell ID (PCI) may be detected, at 2006.

A hierarchical approach may not be used in some synchronizations. For example, a one-step approach to obtain physical cell ID may (e.g., may instead) be used. A physical cell identity (PCI), $N_{PCI}$, may be defined, for example, by Eq. 12:

$$N_{PCI}=N_{GID} \qquad \text{Eq. 12}$$

$N_{GID}$ may be a physical layer cell identity (e.g., 0 to N−1, where N=N1×N2), which may be provided by NR-SSS. $N_{CID}$ may not be used. $N_{CID}$ may be set to zero. $N_{CID}$ may not be provided by NR-PSS. The arrangement may crate N=N1×N2 unique physical cell identities.

FIG. 21 is an example of a (e.g., an NR) synchronization. The synchronization may use, for example, NR-SSS with a SYNC payload and/or NR-SBCH to carry information of physical cell ID.

NR-PSS may detect a symbol timing synchronization, at 2102. The NR-SSS may detect a frame timing synchronization and a Cell ID, at 2104. For example, the Cell ID (e.g., the final Cell ID) may be referred to as N. The features of 2102 and 2104 may be combined. For example, the frame timing synchronization and physical Cell ID (PCI) may be detected, at 2106.

Figure 22:
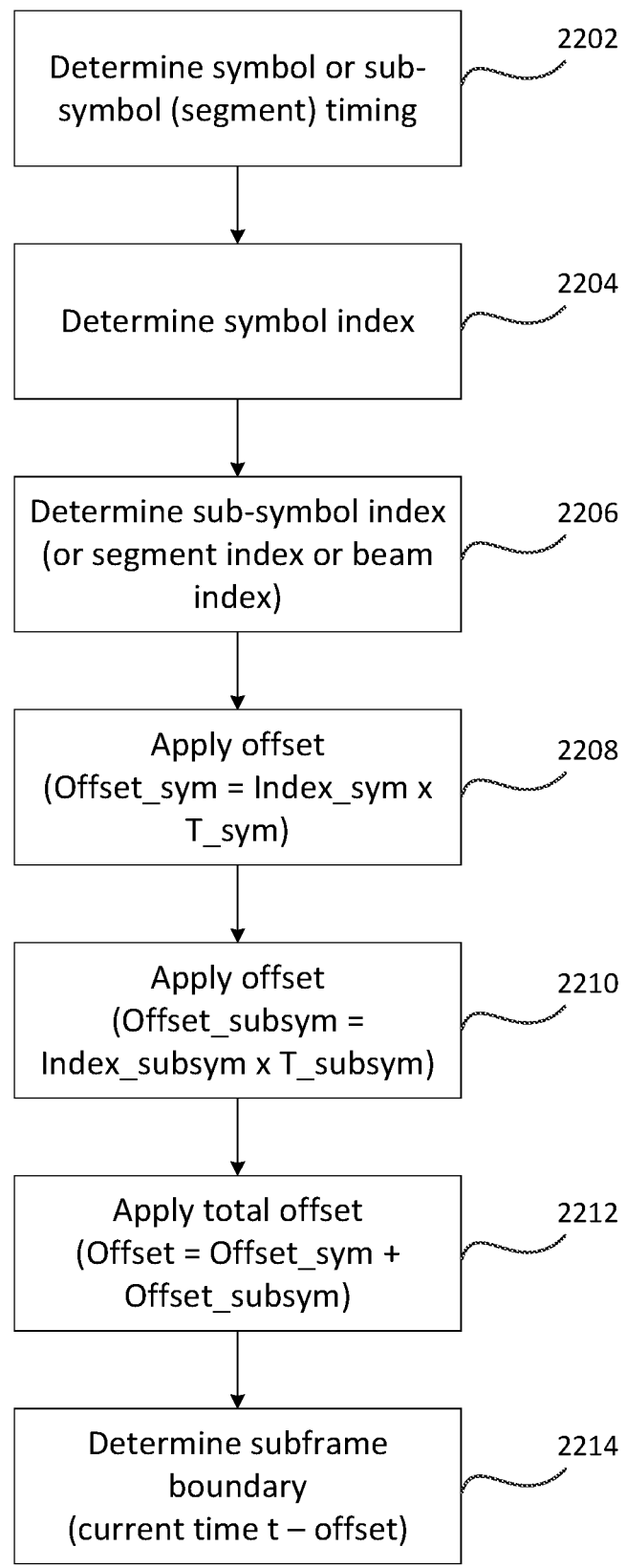
FIG. 22 is an example determination of a subframe boundary.

FIG. 22 is an example determination of a subframe boundary. In examples, a WTRU may determine symbol or sub-symbol (e.g., segment) timing, at 2202. A WTRU may determine a symbol index, at 2204. A WTRU may determine a sub-symbol index, segment index, and/or beam index, at 2206. A WTRU may apply a first offset, at 2208. For example, a WTRU may apply a first offset, for example, according to Eq. 13:

$$\text{Offset\_sym}=\text{Index\_sym}\times T\text{\_sym} \qquad \text{Eq. 13}$$

A WTRU may apply a second offset, at 2210. For example, a WTRU may apply a second offset, according to Eq. 14:

$$\text{Offset\_subsym}=\text{Index\_subsym}\times T\text{\_subsym} \qquad \text{Eq. 14}$$

A WTRU may apply a total combined offset, at 2212. For example, a WTRU may apply the total combined offset from Eq. 13 and Eq. 14, for example, according to Eq. 15:

$$\text{Offset}=\text{Offset\_sym}+\text{Offset\_subsym} \qquad \text{Eq. 15}$$

A WTRU may determine a subframe boundary, at 2214. For example, a WTRU may determine a subframe boundary, according to Eq. 16:

$$\text{Subframe Boundary}=\text{current time } t- \text{ offset} \qquad \text{Eq. 16}$$

A waveform based error check may be provided for non-systematic Polar codes. A waveform based data integrity check and/or error check for a non-systematic Polar code may focus on performance enhancement and/or overhead reduction. A unique word error check (UW-EC) based data integrity check with non-systematic PC Polar codes may provide error check (or detection) and/or error correction, e.g., by PC and/or EC bits. EC bits from UW-EC may be used, for example, to assist PC bits in PC Polar codes, e.g., to enhance the accuracy of PC bits. EC bits from UW-EC may be used (e.g., may alternatively be used) to replace PC bits in PC Polar codes, for example, to reduce or eliminate overhead due to PC bits.

Figure 23:
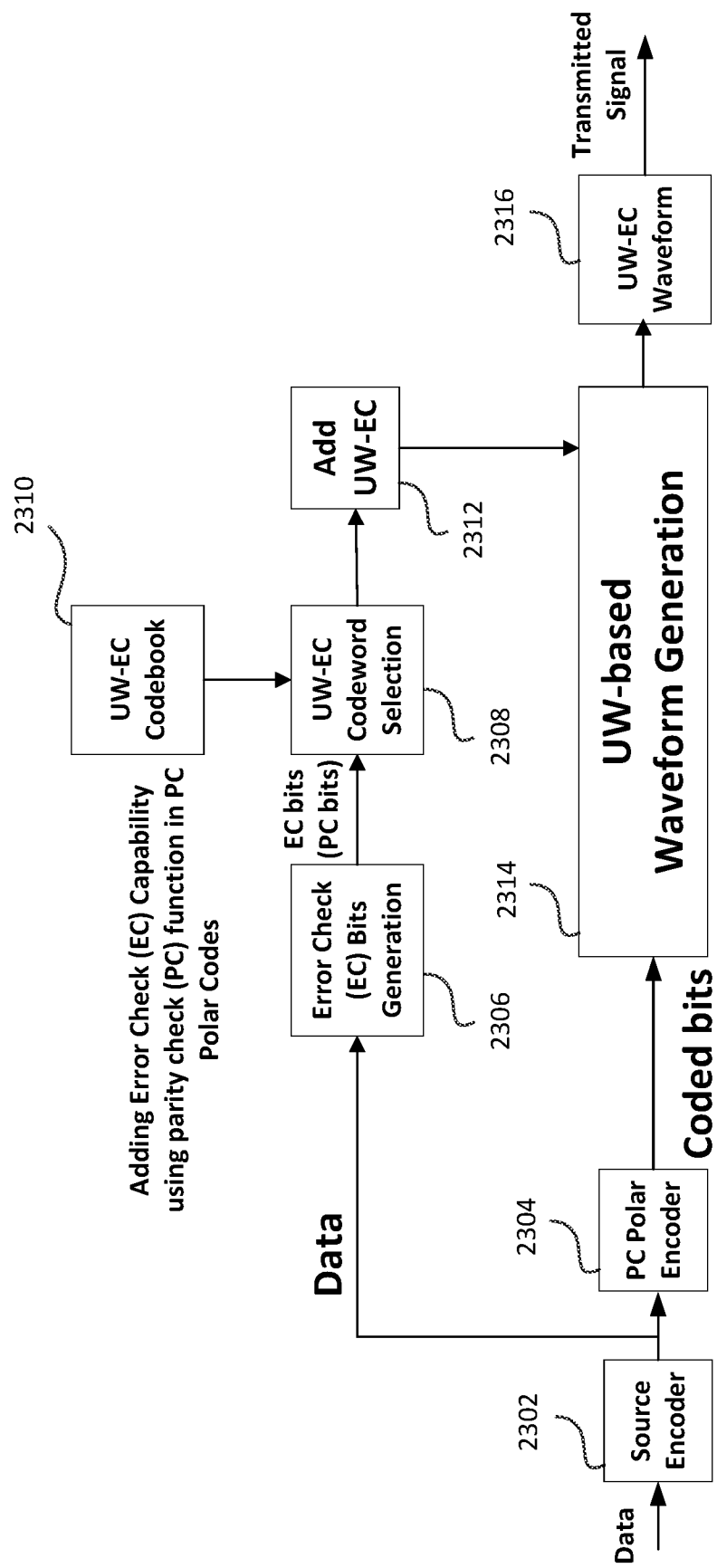
FIG. 23 is an example of a transmitter for a unique word error check (UW-EC) based data integrity check with non-systematic PC Polar codes.

FIG. 23 is an example of a transmitter for a UW-EC based data integrity check with non-systematic PC Polar codes. An error check (e.g., an error check function (ECF)) may be pre-defined and/or configured to generate EC bits and/or parity check bits for Parity check (PC) Polar codes from data bits, for example, by adding EC and/or PC capability to data, e.g., to assist decoding processing in PC Polar codes. One or more unique words (UWs) may be used (e.g., may be used as an alternative to a PC) for error checking. A UW may (e.g., may already) be available and/or may reduce overhead, for example, when UW is used to replace PC for error checking or decoding in PC Polar codes. Codebook based UW-EC may be used, for example, when error checking may be performed before decoding, e.g., so that decoding latency may be reduced or removed at a receiver or transceiver. Backwards compatibility with CRC checks may be maintained, for example, when a UW may be used for PC in addition to CRC for enhanced error checking.

Data may be input to source encoder 2302 and input into PC Polar encoder 2304, for example, to generate coded bits (parity bits). Data may be, for example, a data packet, control packet, or a combination thereof. Data may be related to transmissions by one or more (e.g., a combination of) one or more data channels, one or more control channels, one or more broadcast channels, and/or the like (e.g., in UL or DL). Data bits may be generated (e.g., may be generated by a transmitter) without a cyclic redundancy check (CRC).

Error Check (EC) Bits generation may be performed. For example, data (e.g., data bits) may be input into an Error Check (EC) bit generator 2306. For example, data bits may be input into an EC bit generator 2306 to add EC capability, e.g., by generating EC bits or PC bits to assist PC Polar decoding. EC bits and/or PC bits may be used to select a UW-EC codeword (e.g., u or c) at a UW-EC codeword selection 2308 and/or based on a UW-EC codebook 2310.

A UW (e.g., UW-based) waveform generator 2314 may generate a UW waveform, for example, based on coded bits from a channel encoder. A UW waveform may be generated for a transmitter and/or the like. A UW-EC codeword may be selected at 2308, for example, to generate one or more UW-EC sequences, which may be added at 2312 to a signal (e.g., at UW waveform generator 2314), for example, by inserting c or adjusting u. An adjustment to u may be made, for example, in accordance with the condition provided in Eq. 17:

$$M_{22}u=c \qquad \text{Eq. 17}$$

A UW-EC waveform may be generated (e.g., may be generated by UW-EC waveform 2316) to be sent as a transmitted signal.

Figure 24:
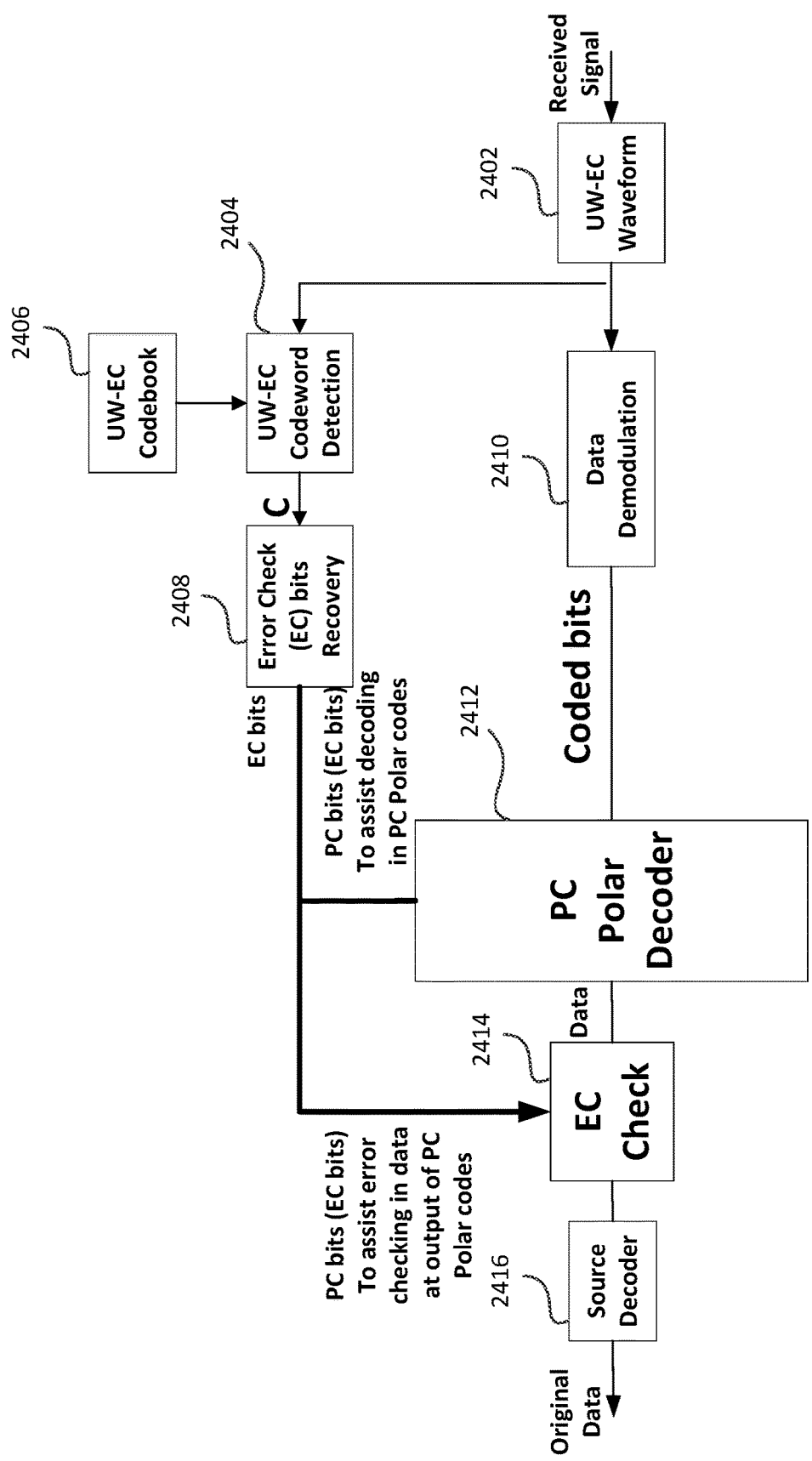
FIG. 24 is an example of a receiver for a UW-EC based data integrity check with non-systematic PC Polar codes.

FIG. 24 is an example of a receiver for a UW-EC based data integrity check with non-systematic PC Polar codes. A received signal may be processed by a UW-EC waveform 2402, for example, to detect one or more UW-EC sequences and/or to provide a signal to a data demodulation. A UW-EC waveform 2402 may (e.g., may also) provide a signal to a UW-EC codeword detection 2404. A UW-EC codeword c may be detected by a UW-EC codeword detection 2404, for example, using a UW-EC codebook 2406. A receiver may communicate with a transmitter, for example, so that a UW-EC codebook 2406 may be synchronized (e.g., synchronized with another UW-EC codebook). One or more codebooks may be pre-defined or configured, for example, to permit a receiver to decode a signal using one or more blind detections.

PC bits and/or EC bits may be generated from codeword c by an EC bits recovery 2408. PC bits and/or EC bits may be fed to a PC Polar decoder 2412, e.g., to assist PC Polar decoding. Demodulated data by a data demodulation 2410 may be fed to a PC Polar decoder 2412.

EC bits generated from a UW (e.g., referred to as UW-EC) may be fed to a PC Polar decoder (e.g., PC Polar Decoder 2412) to assist PC Polar decoding. A UW-EC may be used, for example, to provide a PC integrity check of PC bits in PC Polar Codes, e.g., if the value of a PF-frozen set may be set by a PC.

PC bits generated from UW (e.g., referred to as UW-PC) may be fed to a PC Polar decoder (e.g., PC Polar decoder 2412), for example, to replace PC bits in PC Polar decoding (e.g., in case the value of PF-frozen set may not be set by a PC).

PC/EC bits generated from UW (e.g., referred to as UW-PC/EC) may (e.g., may also) be fed to an EC check 2414 for error checking in data. PC Polar decoded data may be fed to an EC check 2414 that may utilize PC bits and/or EC bits to output a signal for a source decoder (e.g., Source Decoder 2416) to process and source decode to output data. The output data may be the original data.

Features, elements and actions (e.g., processes and instrumentalities) are described by way of non-limiting examples. While examples are directed to LTE, LTE-A, New Radio (NR) or 5G specific protocols, subject matter herein is applicable to other wireless communications, systems, services and protocols. Each feature, element, action or other aspect of the described subject matter, whether presented in figures or description, may be implemented alone or in any combination, including with other subject matter, whether known or unknown, in any order, regardless of examples presented herein.

Systems, methods and instrumentalities have been disclosed for error check-based synchronization. For example, additional information may be provided by a secondary synchronization signal (SSS), e.g., in New Radio (NR). An SSS may bear additional information alone or in conjunction (jointly) with a primary synchronization signal (PSS) and/or a Physical Broadcast Channel (PBCH). Additional information may be in the form of, for example, data, a coded sequence or a hybrid thereof. An SSS may be provided with error checking and may be encoded, e.g., with Polar codes. Waveform based error checking may be provided, e.g., for non-systematic Polar codes. A reference signal may be provided for an error check-based synchronization signal. An SSS may be sequence-based.

A WTRU may refer to an identity of the physical device, or to the user's identity such as subscription related identities, e.g., MSISDN, SIP URI, etc. WTRU may refer to application-based identities, e.g., user names that may be used per application.

The processes described above may be implemented in a computer program, software, and/or firmware incorporated in a computer-readable medium for execution by a computer and/or processor. Examples of computer-readable media include, but are not limited to, electronic signals (transmitted over wired and/or wireless connections) and/or computer-readable storage media. Examples of computer-readable storage media include, but are not limited to, a read only memory (ROM), a random access memory (RAM), a register, cache memory, semiconductor memory devices, magnetic media such as, but not limited to, internal hard disks and removable disks, magneto-optical media, and/or optical media such as CD-ROM disks, and/or digital versatile disks (DVDs). A processor in association with software may be used to implement a radio frequency transceiver for use in a WTRU, terminal, base station, RNC, and/or any host computer.

What is claimed is:

1. A network device, comprising:
   a processor configured to:
   determine Physical Broadcast Channel (PBCH) data;
   perform a first scrambling of the PBCH data via a first sequence, wherein the first sequence is a function of a cell ID and timing information;
   attach error check bits to the scrambled PBCH data and to the timing information, wherein the error check bits comprise one or more cyclic redundancy check (CRC) bits and the timing information is unscrambled;
   polar encode the scrambled PBCH data, the unscrambled timing information, and the attached error check bits, wherein the polar encoding results in polar encoded bits; and
   perform a second scrambling of the polar encoded bits via a second sequence.

2. The network device of claim 1, wherein the timing information comprises at least one of a system frame number, a subset of a system frame number, a half radio frame number, or a synchronization signal (SS) block index.

3. The network device of claim 1, wherein the first sequence and the second sequence are different.

4. The network device of claim 1, wherein the processor is further configured to transmit the scrambled polar encoded bits.

5. The network device of claim 4, wherein the processor is further configured to transmit the scrambled polar encoded bits via a waveform.

6. The network device of claim 4, wherein the PBCH data is new radio (NR)-PBCH data.

7. A method, comprising:
   determining Physical Broadcast Channel (PBCH) data;
   performing a first scrambling of the PBCH data via a first sequence, wherein the first sequence is a function of a cell ID and timing information;
   attaching error check bits to the scrambled PBCH data and to the timing information, wherein the error check bits comprise one or more cyclic redundancy check (CRC) bits and the timing information is unscrambled;
   polar encoding the scrambled PBCH data, the unscrambled timing information, and the attached error check bits, wherein the polar encoding results in polar encoded bits; and
   performing a second scrambling of the polar encoded bits via a second sequence.

8. The method of claim 7, wherein the timing information comprises at least one of a system frame number, a subset of a system frame number, a half radio frame number, or a synchronization signal (SS) block index.

9. The method of claim 7, wherein the first sequence and the second sequence are different.

10. The method of claim 7, further comprising transmitting the scrambled polar encoded bits.

11. The method of claim 10, further comprising transmitting the scrambled polar encoded bits via a waveform.

12. The method of claim 10, wherein the PBCH data is new radio (NR)-PBCH data.

* * * * *